United States Patent
Imaki et al.

(10) Patent No.: US 6,567,437 B1
(45) Date of Patent: May 20, 2003

(54) WAVELENGTH MONITORING DEVICE AND ITS ADJUSTING METHOD, AND WAVELENGTH STABILIZING LIGHT SOURCE AND TRANSMISSION SYSTEM HAVING PLURAL WAVELENGTH STABILIZING LIGHT SOURCE

(75) Inventors: Masao Imaki, Tokyo (JP); Yoshihito Hirano, Tokyo (JP); Makoto Satou, Tokyo (JP); Kenji Masuda, Tokyo (JP); Takeshi Nakamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/617,089

(22) Filed: Jul. 14, 2000

Related U.S. Application Data

(63) Continuation of application No. PCT/JP00/02047, filed on Mar. 30, 2000.

(30) Foreign Application Priority Data

Jan. 31, 2000 (JP) ........................................ 2000-022537

(51) Int. Cl.⁷ ................................................. H01S 3/13
(52) U.S. Cl. ......................................................... 372/32
(58) Field of Search ..................................... 372/32, 20

(56) References Cited

U.S. PATENT DOCUMENTS

| | | | |
|---|---|---|---|
| 4,890,922 A | | 1/1990 | Wilson |
| 5,040,896 A | * | 8/1991 | Moslehi ...................... 356/453 |
| 5,107,512 A | | 4/1992 | Shibutani |
| 5,809,048 A | * | 9/1998 | Shichijyo ..................... 372/32 |
| 5,825,792 A | | 10/1998 | Villeneuve et al. ............ 372/32 |
| 5,956,356 A | | 9/1999 | Bergmann et al. ............. 372/32 |

FOREIGN PATENT DOCUMENTS

| | | |
|---|---|---|
| JP | 1113626 A | 5/1989 |
| JP | 2228625 A | 9/1990 |
| JP | 4102821 A | 4/1992 |
| JP | 4286925 A | 10/1992 |
| JP | 510821 A | 1/1993 |
| JP | 5188221 A | 7/1993 |
| JP | 613983 A | 1/1994 |
| JP | 7248339 A | 9/1995 |
| JP | 815035 A | 1/1996 |
| JP | 8328061 A | 12/1996 |
| JP | 972787 A | 3/1997 |
| JP | 1022559 A | 1/1998 |
| JP | 2736105 | 9/1998 |
| JP | 10270800 A | 10/1998 |
| JP | 10339668 A | 12/1998 |
| JP | 1187826 A | 3/1999 |

OTHER PUBLICATIONS

Transaction of the IECIE, B–10–180, "Convention of Communication Society of 1998".

* cited by examiner

Primary Examiner—Quyen Leung
Assistant Examiner—Jeffrey Zahn
(74) Attorney, Agent, or Firm—Birch, Stewart, Kolasch & Birch, LLP

(57) ABSTRACT

A wavelength monitoring device comprising: a polarization state changing means having a first birefringent crystal, which inputs a polarized laser light and changes the polarization state of the input laser light after it is transmitted through the first birefringent crystal, in accordance with the wavelength of the input laser light, a polarized light selecting and receiving means, which inputs the laser light transmitted through the polarization state changing means and selectively receives a predetermined linearly polarized component, and a wavelength detection means for monitoring the wavelength of the laser light input to the first birefringent crystal by use of an optical signal output from the polarized light selecting and receiving means.

116 Claims, 7 Drawing Sheets

US 6,567,437 B1

WAVELENGTH MONITORING DEVICE AND ITS ADJUSTING METHOD, AND WAVELENGTH STABILIZING LIGHT SOURCE AND TRANSMISSION SYSTEM HAVING PLURAL WAVELENGTH STABILIZING LIGHT SOURCE

CROSS-REFERENCE TO THE RELATED APPLICATION

This Application is a continuation of International Application No. PCT/JP00/02047, whose international filing date is Mar. 30, 2000, the disclosures of which Application are incorporated by reference herein.

BACKGROUND OF THE INVENTION

1. Field of the Invention

The present invention generally relates to a wavelength monitoring device for monitoring the wavelength of a laser light, its adjusting method, a wavelength stabilizing light source for emitting a laser light of a stable wavelength and also a transmission system provided with a plurality of such wavelength stabilizing light sources, and more particularly to an industrial technique which is applicable to the method of wavelength division multiplexing transmission (hereinafter referred to just as "WDM").

2. Description of the Related Art

In the recent trend of optical communications, various transmission methods have been investigated to cope with a vastly increasing amount of information to be transmitted. Among those transmission methods, the above-mentioned WDM method has been developed for increasing transmission capacity by multiplexing various optical signals of different wavelengths and transmitting the thus multiplexed optical signals concurrently. However, even though a plurality of optical signals of different wavelengths are multiplexed and transmitted concurrently, no wavelength outside the band in which it is amplifiable by an amplifier can be used, and thus, in order to multiplex various optical signals and transmit concurrently the thus multiplexed light signals, it will be the most significant requirement to reduce the wavelength of individual optical signals, and also reduce the intervals between the wavelength of individual optical signals. In order to meet this requirement, a technique for monitoring the wavelength of optical signals of a narrow band and stabilizing the thus monitored wavelength in high precision has been required.

(First Prior Art)

FIG. 1 is a schematic diagram showing the wavelength monitoring device according to a first prior art as described in "Convention of Communication Society of 1998", the transaction of the Institute of Electronics, Communication, and Information Engineers (B-10-180). In the figure, reference numeral 101 denotes a first beam splitter for separating an incident light, numeral 102 denotes a second beam splitter for separating the input light passed through the first beam splitter 101, 103 denotes a first photo-diode (hereinafter referred to just as "PD") for receiving one part of the incident light separated by the first beam splitter 101, 104 denotes a second PD for receiving one part of the input light separated by the second beam splitter 102, 105 denotes a first Fabry-Perrot Etalon filter (hereinafter referred to just as "FP Etalon Filter") disposed between the first beam splitter 101 and the first PD 103, 106 denotes a second FP Etalon filter disposed between the second beam splitter 102 and the second PD 104. Here, the first FP Etalon filter 105 and the second FP Etalon filter 106 have different wavelength transmission characteristics.

The operation of the device is explained below.

One part of the incident light separated in the first beam splitter 101 is transmitted through the first FP Etalon filter 105, and is received by the first PD 103 thereafter. Similarly, one part of the input light separated in the second beam splitter 102 is transmitted through the second FP Etalon Filter 106, and is received by the second PD 104 thereafter.

Since the first Etalon filter 105 and the second Etalon filter 106 have different wavelength transmission characteristics from each other, the signals emit from these first and second PDS 103 and 104 show respectively different wave characteristics from each other. For this reason, as to the difference between the output signal from the first PD 103 and that from the second PD 104, the strength of the difference signal therebetween becomes zero if the input light is of the wavelength at which the signal strength of the light transmitted through the first Etalon filter 105 and that transmitted through the second Etalon filter 106 are made equal to each other. Due to this, if the wavelength at which the strength of the difference signal becomes zero is made a reference wavelength, the degree of a change in the wavelength of the incident light varied from the reference wavelength can be represented by the strength of the difference signal having either a positive or a negative symbol.

(Second Prior Art)

FIG. 2 is a schematic diagram showing the wavelength monitoring device according to the second prior art, which is disclosed in the U.S. Pat. No. 5,825,792. In the figure, reference numeral 111 denotes a DFB (Distributed Feed Back) semiconductor laser, numeral 112 denotes an optical lens for adjusting the width of the beam spot emitted from the DFB semiconductor laser 111, numerals 113 and 114 denote respectively a first and a second PDs for receiving lights emitted from the semiconductor laser 111 and transmitted through the optical lens 112, numeral 115 denotes an FP Etalon filter disposed between the optical lens 112 and both the first and second PDs 113 and 114, numeral 116 denotes a subtractor for obtaining the difference between the signal output from the first PD 113 and that output from the second PD 114, and feeds the thus obtained value back to the DFB semiconductor laser 111. The first and the second PDs are disposed separately from each other within the light transmitted through the FP Etalon filter 115, and are fixed to a common base 117. The FP Etalon filter 115 is disposed in an inclined manner with respect to the optical axis.

The operation of the device is explained below.

The width of the beam spot of the light emitted from the DFB semiconductor laser 111 is adjusted at the optical lens 112, transmitted through the FP Etalon filter 115, and finally received by the first and second PDs 113 and 114.

Since the FP Etalon filter 115 is disposed in an inclined manner with respect to the optical axis, an incident angle against the FP Etalon filter 115 varies depending on the position of the incident light beam, and the wavelength transmission characteristic also varies in accordance with the thus varied incident angle. For this reason, the signals output from the first PD 113 and the second PD 114 disposed separately from each other within the light beam transmitted through the FP Etalon filter 115 have respectively different wavelength characteristics. In other words, FP Etalon filters having different wavelength transmission characteristics from each other are not required, but only one FP Etalon filter is required for obtaining two signals having different wavelength transmission characteristics from each other. Due to this, when the first and the PD filters 113 and 114 are disposed in such a manner that the strength of the incident lights thereto are made equal at the reference wavelength $\lambda 0$, the strength of the difference signal from the subtractor 116 becomes 0 at the reference wavelength λ0, so that the change in the wavelength of the emitted light from the DFB semiconductor laser 111 varied from the reference wavelenth can be represented by the strength of the difference signal having either a positive or a negative symbol.

The difference signal is fed back to the DFB semiconductor laser 111, and the wavelength of the light emitted from the DFB semiconductor laser 111 is thus stabilized.

Since the wavelength monitoring device according to the first prior art is configured as mentioned before, wherein two beam splitters, two PDs, and two FP Etalon filters are provided, there has been a problem that the number of components is increased, and thus the total size of the device is thereby increased.

In addition to this, since two beam splitters are used, three light propagating directions are generated, and thus the alignment thereof is quite difficult.

Still further, since the wavelength transmission characteristics of these two FP Etalon filters used therein vary due to a temperature change, there has been such a problem that the wavelength at which the strength of the difference signal becomes zero is deviated due to the temperature change, and thus correction in accordance with temperature change is required. Specially, in the case of the first prior art in which two FP Etalon filters whose wavelength transmission characteristics vary due to a temperature change are used, there has been a drawback that the wavelength transmission characteristic varies per each FP Etalon filter due to a temperature change, so that correction in compliance with the temperature change is made difficult, and subsequently a precise wavelength monitoring cannot be expected.

Still further, the wavelength monitoring device according to the second prior art is configured as explained above, wherein although two signals having different wavelength characteristics from each other are obtained by disposing the FP Etalon filter in an inclined manner with respect to the optical axis, even within the angle in which the light receiving surface of each PD can expect the DFB semiconductor laser, the incident angle at which the light enters is different depending on the position of the light beam, so that the output signal from each PD is represented just as an average value within the laser light expecting angle, and thus a precise wavelength monitoring is not made possible. In fact, the precision becomes worse, when the open surface area of the FP Etalon filter is expanded and the light receiving surface is made wider.

Still further, the light emitted from the DFP semiconductor laser is not collimated and is propagated with a certain spread. Further since the wavelength characteristic of the output signal from each PD depends on the incident angle of the light with respect to the FP Etalon filter, the position of the first and the second PDs, and that of the FP Etalon filter with respect to the optical axis are extremely limited, and thus the alignment thereof is made difficult.

Yet still further, since the wavelength transmission characteristic of these two FP Etalon filters used therein vary due to a temperature change, the wavelength at which the difference signal becomes zero due to the temperature change, and thus there has been a problem that correction in compliance with the temperature change must be carried out.

The present invention has been proposed to solve the problems aforementioned, and it is an object of the present invention to provide a wavelength monitoring device of a small size that enables an easy alignment and also an accurate wavelength monitoring, together with the adjusting method thereof, and also to provide a wavelength stabilizing light source and a transmission system provided with a plurality of those light sources, by use of a wavelength-monitored signal output from the wavelength monitoring device.

It is also another object of the present invention to provide a wavelength monitoring device that obviates any correction in compliance with a temperature change, together with the adjusting method thereof, and also to provide a wavelength stabilizing light source and a transmission system provided with a plurality of those light sources, by use of a wavelength-monitored signal output from the wavelength monitoring device.

SUMMARY OF THE INVENTION

The wavelength monitoring device according to the present invention comprises a polarization state changing means having a first birefringent crystal, which inputs a polarized laser light and changes the polarization state of the input laser light after it is transmitted through the first birefringent crystal, in accordance with the wavelength of the input laser light, a polarized light selecting and receiving means, which inputs the laser light transmitted through the polarization state changing means and selectively receives a predetermined linearly polarized component, and a wavelength detection method that monitors the wavelength of the laser light input to the first birefringent crystal by use of ran optical signal output from the polarized light selecting and receiving means.

By this configuration, a wavelength monitoring device of a small size, easy alignment, and of high precision can be obtained.

A wavelength monitoring device according to the present invention is constructed such that the polarization state changing means further comprises a second birefringent crystal, which inputs the laser light transmitted through the first birefringent crystal and changes the polarization state of the laser light after it is transmitted through the second birefringent crystal, in accordance with the wavelength of the input laser light, wherein the first and the second birefringent crystals are disposed according to the value of a change in the difference between the refraction index of the first birefringent crystal and that of the second birefringent crystal due to a temperature change, and the length of the propagating direction of the first birefringent crystal and that of the second birefringent crystal are set to a predetermined length, so as to offset the discrepancy between the phase shifted value in the fast axis direction and that in the slow axis direction caused by the change in the difference between the refractive index in the fast axis direction and that in the slow axis direction and also by the change in the length of the propagating direction of the laser light of the first birefringent crystal, which changes being caused due to a temperature change.

By this configuration, a wavelength monitoring device that requires no correction due to a temperature change can be obtained.

The wavelength monitoring device according to the present invention is constructed such that the laser light input to the first birefringent crystal is a linearly polarized light.

By this configuration, a wavelength monitoring device in which the positioning of the birefringent crystal is quite easy can be obtained.

The wavelength monitoring device according to the present invention is constructed such that the first birefringent crystal is disposed in such a manner that its fast axis is inclined for 45 degrees with respect to the polarizing direction of the laser light input to the first birefringent crystal.

The wavelength monitoring device according to the present invention is constructed such that the polarized light selecting and receiving mean comprises a polarized light separating means for inputting the laser light transmitted through the polarization state changing means and extracting a predetermined linearly polarized component therefrom, and a polarized light receiving means for receiving the linearly polarized component extracted from the polarized light separating means.

The wavelength monitoring device according to the present invention further comprising: a laser light receiving means for receiving the laser light that has not passed through the polarized light separating means, and a strength detection means for monitoring the change in the strength of a laser light source whose wavelength is to be monitored, by use of an optical signal output from the laser light receiving means.

By this configuration, a wavelength monitoring device capable of monitoring the strength of a laser light can be obtained.

The wavelength monitoring device according to the present invention further comprising a light condensing means for condensing the linearly polarized component extracted from the polarized light separating means between the polarized light separating means and the polarized light receiving means.

By this configuration, a small-sized wavelength monitoring device having the polarized light receiving means of a small size can be obtained.

The wavelength monitoring device according to the present invention is the one in which the polarized light separating means is provided on an input-side surface of the polarized light receiving means.

By this construction, a wavelength monitoring device having a small number of components used therein and its alignment is thus facilitated can be obtained.

The wavelength monitoring device according to the present invention is the one in which the polarized light separating means inputs a laser light transmitted through the polarization state changing means and separates it into a first linearly polarized component and a second linearly polarized component polarizing at right angles to each other and extracts the thus separated components, and the polarized light receiving means further comprises a light receiving means for the first component for receiving the first linearly polarized component extracted from the polarized light separating means, and also a light receiving means for the second component for receiving the second linearly polarized component extracted from the polarized light separating means.

By this configuration, a wavelength monitoring device capable of performing a wavelength monitoring in high precision by use of two signals of different wavelength characteristics can be obtained.

The wavelength monitoring device according to the present invention is constructed such that the polarized light separating means further comprises a polarizer for transmitting either one of the first linearly polarized component and the second linearly polarized component, while reflecting the other.

By this configuration, a wavelength monitoring device capable of easily separating the laser light transmitted through the polarization state changing means into the p-polarized component and the s-polarized component can be obtained The wavelength monitoring device according to the present invention is constructed such that the polarized light separating means further comprises a 2-quadrant polarizer provided with a first area for inputting a laser light transmitted through the polarization state changing means and transmitting only the first linearly polarized component, and a second area for inputting a laser light transmitted through the polarization state changing means and transmitting only the second linearly polarized component.

By this configuration, the laser light propagating direction is made only to one direction, so that a wavelength monitoring device capable of performing an easy alignment can be obtained.

The wavelength monitoring device according to the present invention is the one in which the polarized light separating means further comprises a laser light 3-dividing element provided with a first area for inputting a laser light transmitted through the polarization state changing means and transmitting only the first linearly polarized component, a second area for inputting a laser light transmitted through the polarization state changing means and transmitting only the second linearly polarized component, and a third area for inputting a laser light transmitted through the polarization state changing means and transmitting it without changing its polarization state.

By this configuration, the laser light propagating direction is made only to one direction, so that a wavelength monitoring device capable of performing an easy alignment can be obtained.

The wavelength monitoring device according to the present invention further comprising a laser light receiving means for receiving a laser light transmitted through the third area, and a strength detection circuit for monitoring the change in a laser light source whose wavelength is to be monitored, by use of an optical signal output from the laser light receiving means.

By this configuration, a wavelength monitoring device capable of monitoring the strength of the laser light can be obtained.

The wavelength monitoring device according to the present invention is constructed such that the 2-quadrant polarizer is provided on an output-side surface of the polarization state changing means.

By this configuration, a wavelength monitoring device having a small number of components used therein and its alignment is thus facilitated can be obtained.

The wavelength monitoring device according to the present invention is constructed such that the laser light 3-dividing element is provided on an output-side surface of the polarization state changing means.

By this configuration, a wavelength monitoring device having a small number of components used therein and its alignment is thus facilitated can be obtained.

The wavelength monitoring device according to the present invention is constructed such that the light receiving element for the first component further comprises a first and a second light receiving elements, and the light receiving element for the second component further comprises a third and a fourth light receiving elements.

By this configuration, a wavelength monitoring device capable of easily obtaining a difference signal and a sum signal can be obtained.

The wavelength monitoring device according to the present invention is constructed such that the first to fourth light receiving elements are provided on a same base plate.

By this configuration, a wavelength monitoring device having a small number of components used therein and its alignment is thus facilitated can be obtained.

The wavelength monitoring device according to the present invention is constructed such that the first birefringent crystal, the polarized light separating means and the polarized light selecting and receiving means are disposed such that the input-side and output-side surfaces of each are inclined with respect to the laser light propagating direction.

By this configuration, a wavelength monitoring device having no returned light reflected on the side surfaces can be obtained.

The wavelength monitoring device according to the present invention is constructed such that the wavelength detection means further comprises a divider for outputting the ratio of the optical signal output from the polarized light receiving means to the strength-monitored signal output from the strength detection means.

By this configuration, a wavelength monitoring device capable of performing a wavelength monitoring in high accuracy by use of a quotient signal can be obtained.

The wavelength monitoring device according to the present invention is constructed such that the wavelength detection means further comprises a subtractor for outputting the difference between the optical signal output from the light receiving means for the first component and the optical signal output from the light receiving means for the second component.

By this configuration, a wavelength monitoring device capable of performing a wavelength monitoring in high accuracy by use of a difference signal can be obtained.

The wavelength monitoring device according to the present invention is constructed such that the wavelength detection means further comprises an adder for outputting the sum of the optical signal output from the light receiving means for the first component and the optical signal output from the light receiving means for the second component.

By this configuration, a wavelength monitoring device capable of performing a wavelength monitoring in high accuracy by use of a sum signal can be obtained.

The wavelength monitoring device according to the present invention is constructed such that the wavelength detection means further comprises: a subtractor for outputting the difference between the optical signal output from the light receiving means for the first component and the optical signal output from the light receiving means for the second component, an adder for outputting the sum of the optical signal output from the light receiving means for the first component and the optical signal output from the light receiving means for the second component, and a divider for outputting the ratio of the difference signal output from the subtractor to the sun signal output from the adder.

By this configuration, a wavelength monitoring device capable of performing a wavelength monitoring in high accuracy by use of a quotient signal can be obtained.

The wavelength monitoring device according to the present invention is constructed such that the wavelength detection means further comprises: an adder for outputting the sum of the optical signal output from the light receiving means for the first component and the optical signal output from the light receiving means for the second component, and a divider for outputting the ratio of the optical signal output from either one of the light receiving means for the first component and the optical signal output from the light receiving means for the second component to the sum signal output from the adder.

By this configuration, a wavelength monitoring device capable of performing a wavelength monitoring in high accuracy by use of a quotient signal can be obtained.

The wavelength monitoring device according to the present invention is constructed such that the wavelength detection means further comprises: a subtractor for outputting the difference between the optical signal output from the light receiving means for the first component and the optical signal output from the light receiving means for the second component, and a divider for outputting the ratio of the difference signal output from the subtractor to the strength-monitored signal output from the strength detection means.

By this configuration, a wavelength monitoring device capable of performing a wavelength monitoring in high accuracy by use of a quotient signal can be obtained.

The wavelength monitoring device according to the present invention is constructed such that the wavelength detection means further comprises a divider for outputting the ratio of the optical signal output from either one of the light receiving means for the first component and the optical signal output from the light receiving means for the second component to the strength-monitored signal output from the strength detection means.

By this configuration, a wavelength monitoring device capable of performing a wavelength monitoring of high precision by use of a quotient signal can be obtained.

The wavelength monitoring device according to the present invention is constructed such that the subtractor further comprises: a first gain adjuster for adjusting the strength of the optical signal output from the light receiving means for the first component, and a second gain adjuster for adjusting the strength of the optical signal output from the light receiving means for the second component.

By this configuration, a wavelength monitoring device capable of arbitrarily adjusting a reference wavelength can be obtained.

The wavelength monitoring device according to the present invention is constructed such that when the wavelength of a laser light input to the first birefringent crystal is $\lambda$, the difference between the refractive index in the fast axis direction of the first birefringent crystal and that in the slow axis direction of the same is $\Delta n$, and the length of the propagating direction of the laser light of the first birefringent crystal is L, then the value obtained by $\lambda^2/(\Delta n L)$ becomes 0.8 nm or more.

By this configuration, a wavelength monitoring device capable of performing a wavelength monitoring of a plurality of channels can be obtained.

The wavelength monitoring device according to the present invention is constructed such that the lengths of the propagating direction of the first and second birefringent crystals are set in such a manner that the value of $(d\Delta n_A/dT + \alpha_A \cdot \Delta n_A) \cdot L_A + (d\Delta n_B/dT + \alpha_B \cdot \Delta n_B) \cdot L_B$ becomes zero.

By this configuration, a wavelength monitoring device that requires no correction due to a temperature change can be obtained.

The wavelength monitoring device according to the present invention is constructed such that when the value of $d\Delta n_A/dT$ and that of $\Delta n_B/dT$ are both positive or both negative, the first and second birefringent crystals are disposed such that the fast axis direction of the first birefringent crystal coincides with the slow axis direction of the second birefringent crystal, whereas the slaw axis direction of the first birefringent crystal coincides with the fast axis direction of the second birefringent crystal.

By this configuration, a wavelength monitoring device that requires no correction due to a temperature change can be obtained.

The wavelength monitoring device according to the present invention is constructed such that when either one of the value of $d\Delta n_A/dT$ and that of $\Delta n_B/dT$ is positive, and the other one is negative, the first and second birefringent crystals are disposed such that the fast axis direction of the first birefringent crystal and that of the second birefringent crystal coincide with each other, whereas the slow axis direction of the first birefringent crystal and that of the second birefringent crystal also coincide with each.

By this configuration, a wavelength monitoring device that requires no correction due to a temperature change can be obtained.

The wavelength monitoring device according to the present invention is constructed such that the lengths of the propagating direction of the first and second birefringent crystals are set in such a manner that the value of $(d\Delta n_A/dT+\alpha_A \cdot \Delta n_A)\cdot L_A+(d\Delta n_B/dT+\alpha_B \cdot \Delta n_B)\cdot L_B$ becomes zero, and also the value of $\lambda^2/(\Delta n \cdot L_A - \Delta n \cdot L_B)$ satisfies a desired value.

By this configuration, a wavelength monitoring device that does not require any correction due to a temperature change can be obtained.

The wavelength monitoring device according to the present invention is constructed such that the lengths of the propagating direction of the first and second birefringent crystals are set in such a manner that the value of $(d\Delta n_A/dT+\alpha_A \cdot \Delta n_A)\cdot L_A+(d\Delta n_B/dT+\alpha_B \cdot \Delta n_B)\cdot L_B$ becomes zero, and also the value of $\lambda^2/(\Delta n \cdot L_A + \Delta n \cdot L_B)$ satisfies a desired value.

By this configuration, a wavelength monitoring device that requires no correction due to a temperature change can be obtained.

The wavelength monitoring device according to the present invention is constructed such that when the wavelength of the laser light input to said first birefringent crystal is $\lambda$, the difference between the refractive index in the fast axis direction of said first birefringent crystal and that in the slow axis direction of the same is $\Delta n_A$, the length of the propagating direction of the laser light of said first birefringent crystal is $L_A$, the difference between the refractive index in the fast axis direction of said second birefringent crystal and that in the slow axis direction of the same is $\Delta n_B$, and the length of the propagating direction of the laser light of said second birefringent crystal is $L_B$, then the value of $\lambda^2/(\Delta n \cdot L_A - \Delta n \cdot L_B)$ is set to be 0.8 nm or more.

By this configuration, a wavelength monitoring device capable of performing wavelength monitoring of a plurality of channels can be obtained.

The wavelength monitoring device according to the present invention is constructed such that when the wavelength of the laser light input to said first birefringent crystal is $\lambda$, the difference between the refractive index in the fast axis direction of said first birefringent crystal and that in the slow axis direction of the same is $\Delta n_A$, the length of the propagating direction of the laser light of said first birefringent crystal is $L_A$, the difference between the refractive index in the fast axis direction of said second birefringent crystal and that in the slow axis direction of the same is $\Delta n_B$, and the length of the propagating direction of the laser light of said second birefringent crystal is $L_B$, then the value of $\lambda^2/(\Delta n \cdot L_A + \Delta n \cdot L_B)$ is set to be 0.8 nm or more.

By this configuration, a wavelength monitoring device capable of performing a wavelength monitoring of a plurality of channels can be obtained.

The wavelength monitoring device according to the present invention is constructed such that the first birefringent crystal is made of a $YVO_4$ crystal, and the second birefringent crystal is made of a $LiNbO_3$ crystal.

The wavelength monitoring device according to the present invention is constructed such that the first birefringent crystal is made of a $YVO_4$ crystal, and the second birefringent crystal is made of a $CaCO_3$ crystal.

The wavelength monitoring device according to the present invention is constructed such that the first birefringent crystal is made of a $YVO_4$ crystal, and the second birefringent crystal is made of a $TiO_2$ crystal.

The wavelength monitoring device according to the present invention is constructed such that the first birefringent crystal is made of a $YVO_4$ crystal, and the second birefringent crystal is made of a $SiO_2$ crystal.

The wavelength monitoring device according to the present invention is constructed such that the first birefringent crystal is made of a $LiNbO_3$ crystal, and the second birefringent crystal is made of a $CaCO_3$ crystal.

The wavelength monitoring device according to the present invention is constructed such that the first birefringent crystal is made of a $LiNbO_3$ crystal, and the second birefringent crystal is made of a $TiO_2$ crystal.

The wavelength monitoring device according to the present invention is constructed such that the first birefringent crystal is made of a $LiNbO_3$ crystal, and the second birefringent crystal is made of a $SiO_2$ crystal.

The wavelength monitoring device according to the present invention is constructed such that the first birefringent crystal is made of a $CaCO_3$ crystal, and the second birefringent crystal is made of a $TiO_2$ crystal.

The wavelength monitoring device according to the present invention is constructed such that the first birefringent crystal is made of a $CaCO_3$ crystal, and the second birefringent crystal is made of a $SiO_2$ crystal.

The wavelength monitoring device according to the present invention is constructed such that the first birefringent crystal is made of a $TiO_2$ crystal, and the second birefringent crystal is made of a $SiO_2$ crystal.

The method of adjusting a wavelength monitoring device according to the present invention includes the step of inclining the first birefringent crystal by rotating it about an axis perpendicular to the propagating direction of the laser light input to the first birefringent crystal.

By this method, such a good effect as an easy adjustment of the wavelength monitoring device can be obtained.

The method of adjusting a wavelength monitoring device according to the present invention includes the step of inclining either one or both of the first and second birefringent crystals by rotating them about an axis perpendicular to the propagating direction of the laser light input to the first and second birefringent crystals.

By this method, such a good effect as an easy adjustment of the wavelength monitoring device can be obtained.

The wavelength stabilizing light source according to the present invention is constructed such that it comprises: a semiconductor laser, a wavelength monitoring device for inputting a laser light incident from the semiconductor laser, and a laser drive control device for activating the semiconductor laser, and controlling the oscillated wavelength of the semiconductor laser by use of a wavelength-monitored signal output from the wavelength monitoring device.

By this configuration, a wavelength stabilizing light source capable of stabilizing the wavelength of a laser light in high accuracy can be obtained.

The laser light stabilizing light source according to the present invention is constructed such that the laser drive control device controls the oscillated wavelength by adjusting the current injected to the semiconductor laser, by use of the wavelength-monitored signal output from the wavelength monitoring device.

By this configuration, a wavelength stabilizing light source whose oscillated wavelength is readily controlled can be obtained.

The laser light stabilizing light source according to the present invention is constructed such that the laser drive control device controls the oscillated wavelength by adjusting the temperature of the semiconductor laser, by use of the wavelength-monitored signal output from the wavelength monitoring device.

By this configuration, a wavelength stabilizing light source whose oscillated wavelength is readily controlled can be obtained.

The laser light stabilizing light source according to the present invention is constructed such that the laser drive control device controls the oscillated wavelength by adjusting the length of a resonator of the semiconductor laser, by use of the wavelength-monitored signal output from the wavelength monitoring device.

By this configuration, a wavelength stabilizing light source whose oscillated wavelength is readily controlled can be obtained.

The laser light stabilizing light source according to the present invention is constructed such that the laser drive control device controls the oscillated wavelength by adjusting the periodic cycle of a diffraction grating provided to the semiconductor laser, by use of the wavelength-monitored signal output from the wavelength monitoring device.

By this configuration, a wavelength stabilizing light source whose oscillated wavelength is readily controlled can be obtained.

The laser light stabilizing light source according to the present invention is constructed such that a laser light collimating means for collimating the laser light emitted from the semiconductor laser is provided between the semiconductor laser and the wavelength monitoring device.

By this configuration, a wavelength stabilizing light source in which a collimated laser light is easily input to a wavelength monitoring device can be obtained.

The laser light stabilizing light source according to the present invention is constructed such that a transmitter means for transmitting the laser light emitted from the semiconductor laser to the wavelength monitoring device is provided between the semiconductor laser and the wavelength monitoring device.

By this configuration, a wavelength stabilizing light source in which the semiconductor laser and the wavelength monitoring device can be used separately can be obtained.

The laser light stabilizing light source according to the present invention is constructed such that the semiconductor laser, the wavelength monitoring device and the laser drive control device are accommodated in one module.

By this configuration, a wavelength stabilizing light source that can be easily handled can be obtained.

The transmission system according to the present invention is constructed such that it is provided with a plurality of laser light stabilizing sources, and one or more than one transmission means for transmitting a laser light.

By this configuration, a transmission system having a plurality of baseband frequencies can be obtained.

DETAILED DESCRIPTION OF THE PREFERRED EMBODIMENTS

Several embodiments for carrying out best the present invention are now explained with reference to attached drawings, in order to explain the present invention to details.

[First Embodiment]

Figure 1:
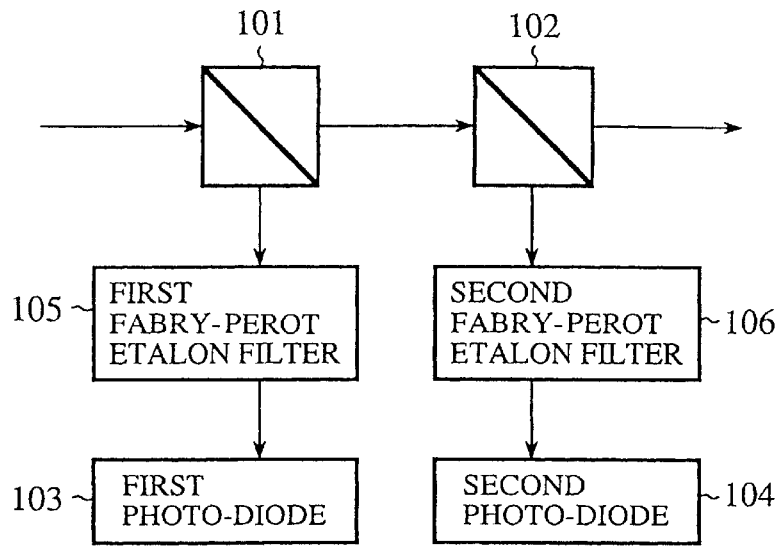
FIG. 1 is a schematic diagram showing the wavelength monitoring device according to the first prior art.
Figure 2:
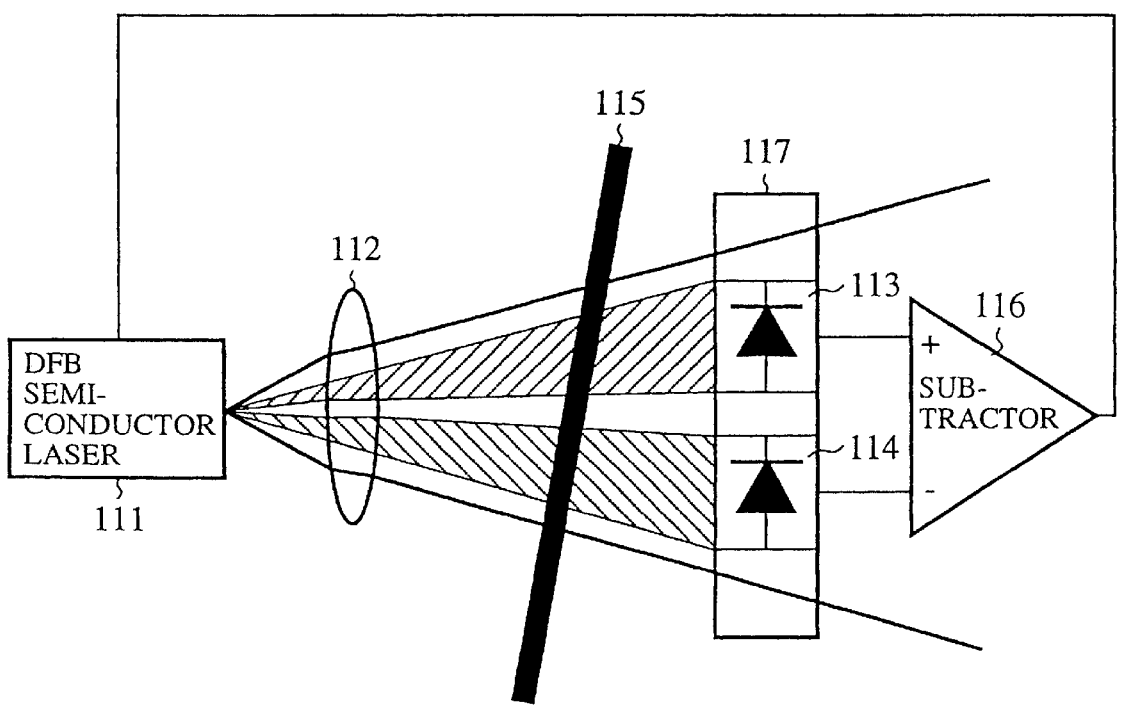
FIG. 2 is a schematic diagram showing the wavelength monitoring device according to the second prior art.
Figure 3:
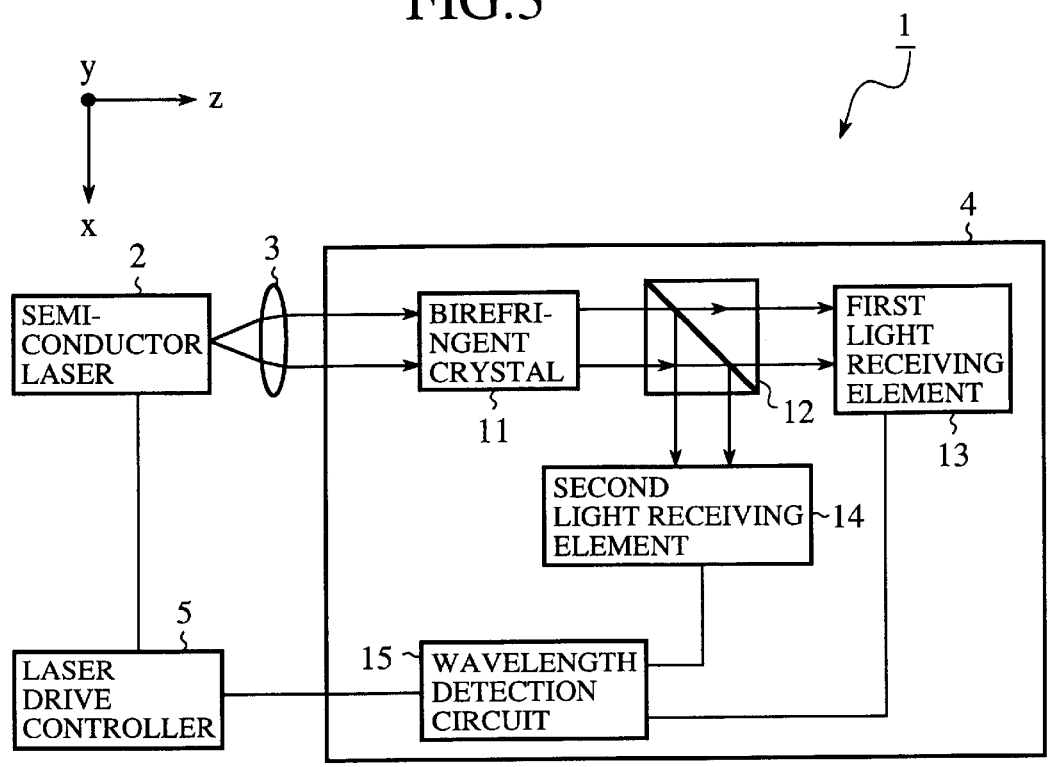
FIG. 3 is a schematic diagram showing the wavelength monitoring device and a wavelength stabilizing light source according to a first embodiment of the present invention.

FIG. 3 is a schematic diagram showing a wavelength monitoring device and a wavelength stabilizing light source according to a first embodiment of the present invention. FIG. 4 is an illustration showing the polarization states of a laser light observed at specific positions in the wavelength monitoring device shown in FIG. 3. The following explanation is about the rectangular coordinates system having x, y and z axes in the respective directions shown in FIG. 3. In the figure, reference numeral 1 denotes a wavelength stabilizing light source, numeral 2 denotes a semiconductor laser for emitting a p-polarized laser light originally polarizing in the x axis direction to the direction of z axis, numeral 3 denotes an optical lens for adjusting the light beam emitted from the semiconductor laser 2 into a collimated state (a laser light collimating means), numeral 4 denotes a wavelength monitoring device, which inputs a p-polarized laser light that is emitted from the semiconductor laser 2 and collimated by the optical lens 3, monitors the wavelength of the thus input laser light, and finally sends it out as a wavelength-monitored signal, and numeral 5 denotes a laser drive control device, which is connected to the semiconductor laser 2, activates the semiconductor laser 2 and controls the oscillated wavelength of the semiconductor laser 2 by use of the wavelength-monitored signal output from the wavelength monitoring device 4.

In the wavelength monitoring device 4, reference numeral 11 denotes a birefringent crystal, which inputs a p-polarized laser light that is emitted from the semiconductor laser 2 and collimated by the optical lens 3, and changes the polarization state of the laser light after its transmission therethrough (polarization state changing configuration/means) in accordance with the wavelength of the input laser light, numeral 12 denotes a polarizer (polarized light separating/selecting means/configuration), which inputs the laser light passed through the birefringent crystal 11, and transmits only the p-polarized component, while reflecting the s-polarized component, thereby to extract the p-polarized component as a first polarized component and the s-polarized component as a second polarized component, which components being vibrated at right angles with each other, 13 denotes a light receiving element (an example of a polarized light receiving means/configuration) for the first component, which receives the p-polarized light beam transmitted through the polarizer 12, and outputs an optical signal in accordance with the strength of the thus received light beam, while 14 denotes a light receiving element for the second component, which receives the s-polarized light beam reflected by the polarizer 12, and outputs an optical signal in accordance with the strength of the thus received light beam, 15 denotes a wavelength detection circuit connected to the laser drive control device 5 (wavelength detection means/configuration) for monitoring the wavelength of the laser light input to the birefringent crystal 11 by use of either one or both of the optical signals output from the light receiving element for the first component 13 and the light receiving element for the second component 14, and thereafter outputs a wavelength-monitored signal.

In this first embodiment, the birefringent crystal 11 configures a polarization state changing means. Further, the light receiving element for the first component 13 and the light receiving element for the second component 14 are provided as polarized light receiving means. Still further, the polarizer 12 and the light receiving element for the first component 13, and the polarizer 12 and the light receiving element for the second component 14, configure a polarized light selecting and receiving means, respectively.

Figures 4A, 4B, 4C, 4D:
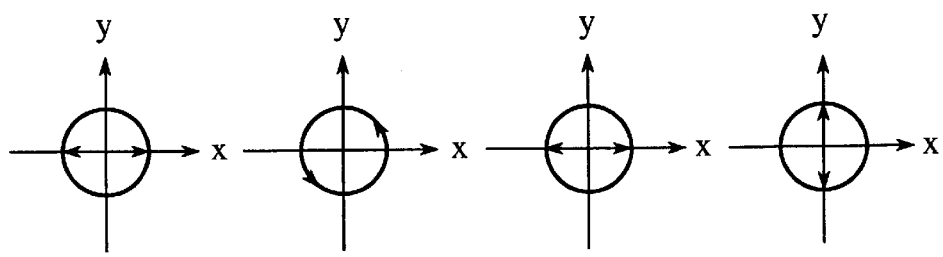
FIG. 4 is an illustration showing the polarization states of a laser light observed at specific positions in the wavelength monitoring device according to the first embodiment of the present invention.

It should be noted that FIG. 4(A) shows the polarization state of a laser light input to the birefringent crystal 11, FIG. 4(B) shows the polarization state of the laser light transmitted through the birefringent crystal 11, FIG. 4(C) shows the polarization state of the laser light transmitted through the polarizer 12, and FIG. 4(D) shows the polarization state of the laser light reflected by the polarizer 12.

Figure 5:
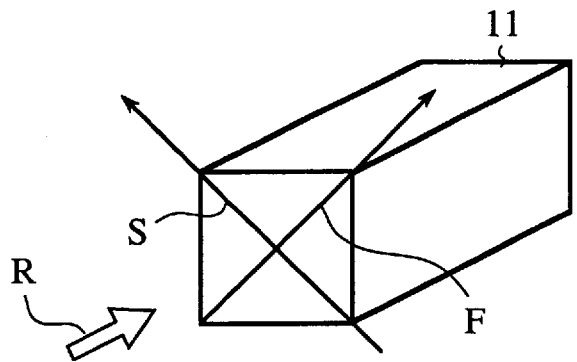
FIG. 5 is an illustration for explaining the disposing direction of the birefringent crystal applied to the wavelength monitoring device according to the first embodiment of the present invention.

The birefringent crystal 11 has an optical anisotropy, and has, as shown in FIG. 5, a fast axis F and a slow axis S intersecting at right angles with each other within the surface perpendicular to the direction R (namely the z-axis direction) in which the incident laser light moves forward. The fast direction F is the direction in which the phase velocity is high but the refractive index is low, whereas the slow direction S is the direction in which the phase velocity is slow, but the refractive index is high. The birefringent crystal 11 is disposed in such a manner that the fast axis F or the slow axis S is inclined for 45 degrees with respect to the polarizing direction of the p-polarized laser light input thereto.

The operation of the device is explained below.

The semiconductor laser 2 emits the p-polarized laser light, which originally vibrates in the x-axis direction, toward the direction of z axis. Thereafter the laser light emitted from the semiconductor laser 2 is collimated by the optical lens 3, and input thereafter to the birefringent crystal 11 in the wavelength monitoring device 4.

Since the phase velocity of the laser light input to the birefringent crystal 11 moves faster in the direction of the fast axis F than in the direction of the slow axis S, the polarization state of the laser light changes when it is transmitted through the birefringent crystal 11. When the wavelength is $\lambda$, the difference of the refractive index between the direction of the fast axis F and that of the slow direction S (namely, the refractive index, which is obtained by subtracting the refractive index in the direction of the fast axis F from the refractive index in the direction of the slow axis S; which will be referred to just as a "difference of refractive index" hereinafter) is $\Delta n$, the length of the laser light propagating direction of the birefringent crystal 11 is L, then the discrepancy $\delta$ between the phase in the fast axis F and that in the slow axis S will be obtained by the equation $\delta = 2\pi \Delta n L / \lambda$.

Generally, in the case where the laser light is propagating in the direction of z axis, and the fast axis F is inclined for an angle $\theta$ with respect to the slow axis S, then the change in the polarization state in the x-axis direction and that in the y-axis direction will be obtained by the following formula (1) by use of Jones' Matrix.

$$J_\delta(\theta) = \begin{pmatrix} \cos\theta & -\sin\theta \\ \sin\theta & \cos\theta \end{pmatrix} \cdot \begin{pmatrix} \exp\left(-i\frac{\delta}{2}\right) & 0 \\ 0 & \exp\left(i\frac{\delta}{2}\right) \end{pmatrix} \cdot \begin{pmatrix} \cos\theta & \sin\theta \\ -\sin\theta & \cos\theta \end{pmatrix} \quad (1)$$

In this embodiment, the direction of the fast axis F is inclined for 45 degrees with respect to the x axis. Further, the laser light moving along the z-axis direction and input to the birefringent crystal 11 is a p-polarized beam, and its polarizing direction is the x-axis direction. Subsequently, if the normalized field component of the laser light input to the birefringent crystal 11 is defined as $\{1, 0\}$, then the field component of the laser light in the x-axis direction transmitted through the birefringent crystal 11, namely the field component of the p-polarized component Etx, and the filed component of the laser beam in the y-axis direction transmitted through the birefringent crystal 11, namely the field component of the s-polarized component Ery, can be represented by the following formula (2) by use of the formula (1).

$$\begin{pmatrix} E_{tx} \\ E_{ry} \end{pmatrix} = \begin{pmatrix} \cos\frac{\delta}{2} & -i\sin\frac{\delta}{2} \\ -i\sin\frac{\delta}{2} & \cos\frac{\delta}{2} \end{pmatrix} \cdot \begin{pmatrix} 1 \\ 0 \end{pmatrix} = \begin{pmatrix} \cos\frac{\delta}{2} \\ -i\sin\frac{\delta}{2} \end{pmatrix} \quad (2)$$

The laser light transmitted through the birefringent crystal 11 is fed to the polarizer 12. The p-polarized component of the laser light thus input to the polarizer 12 is transmitted through the polarizer 12 and is received by the light receiving element for the first component 13. On the other hand, the s-polarized component of the laser light input to the polarizer 12 is reflected by the polarizer 12 and is received by the light receiving element 14 for the second component.

Figure 6:
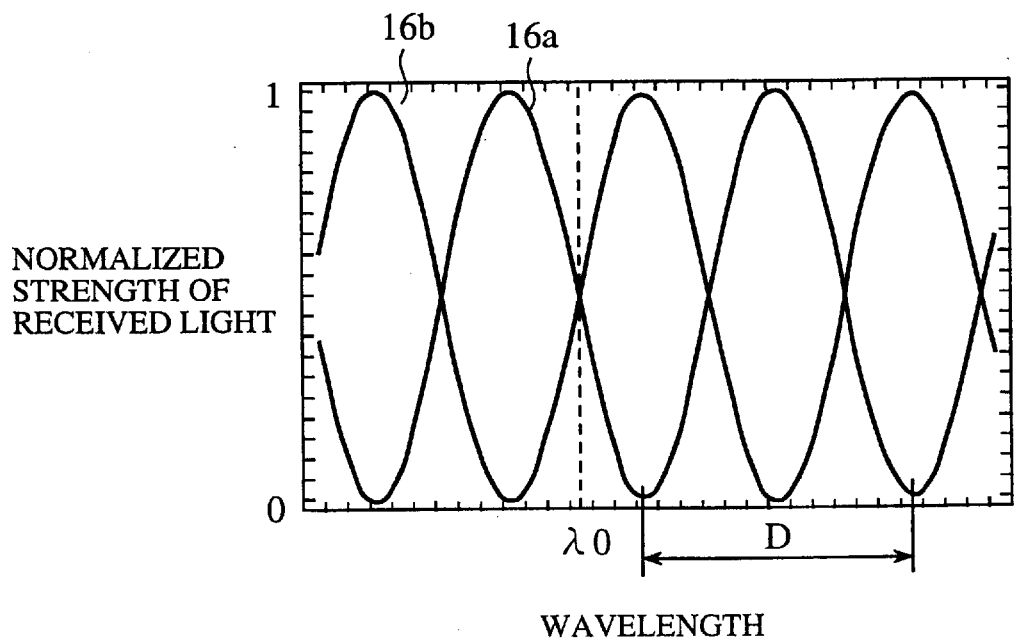
FIG. 6 is an illustration showing the frequency characteristics of a received optical signal.

The normalized electric field component of the p-polarized component received by the light receiving element for the first component 13 is {cos(δ/2), 0}, and the normalized electric field component of the p-polarized component received by the light receiving element for the second component 14 is {0, sin(δ/2)}. For this reason, the normalized strength of the optical signal output from the light receiving element for the first component 13 is a square value of the cos(δ/2), and the normalized strength of the optical signal output from the light receiving element for the second component 14 is a square value of the sin(δ/2). Since the δ varies depending on the wavelength of a light beam, the normalized strength of the light received by the light receiving element for the first component 13 and that received by the light receiving element for the second component 14 vary as shown in FIG. 6, depending on the wavelength. In FIG. 6, reference numeral 16a denotes the strength of the optical signal output from the light receiving element for the first component 13, and 16b denotes the strength of the optical signal output from the light receiving element for the second component 14. Further, reference character D denotes a one-cycle period called a Free Spectrum Range (hereinafter referred to just as FSR), and its value will be represented as shown by formula (3) below.

$$FSR = \frac{c_0}{\Delta n \cdot L} = \frac{\lambda^2}{\Delta n \cdot L} \quad (3)$$

The optical signal output from the light receiving element for the first component 13 and that received by the light receiving element for the second component 14 are input to the wavelength detection circuit 15. The strength of the optical signal output from the light receiving element for the first component 13 reduces as the wave strength becomes longer and increases as it becomes shorter around the point "wavelength λ0" at which 16a and 16a intersect with each other. On the other hand, the strength of the optical signal output from the light receiving element for the second component 14 increases as the wave strength becomes longer, and reduces as it becomes shorter around the point "wavelength λ0". For this reason, if the wavelength λ0 is set as a reference wavelength, the wavelength detection circuit 15 detects a change in the wavelength of the laser light varied from the reference wavelength due to a change in the strength of the optical signal output from the light receiving element for the first component 13, or that of the optical signal output from the light receiving element for the second component 14.

Further, within the slope including the wavelength λ0, the wavelength is uniquely determined from the strength of the optical signal output from the light receiving element for the first component 13, or that of the optical signal output from the light receiving element for the second component 14. For this reason, the wavelength detection circuit 15 can detect also an absolute wavelength of the laser light from the strength of the optical signal output from the light receiving element for the first component 13, or that of the optical signal output from the light receiving element for the second component 14.

When the FSR becomes longer, the wavelength range of one slope is extended. When the wavelength monitoring device 4 is applied to the WDM method, in the case where one of the wavelength regulated by the International Telecommunication Union (hereinafter referred to ust as ITU grid) is λ0, and the ITU grid interval is 25 GHz (0.2 nm), if the FSR is set to 100 GHz (namely more than 0.8 nm), then a change in the wavelength of two or more than two channels within the wavelength range of the slope including the wavelength λ0 can be detected, as well as the absolute wavelength. A longer FSR can be obtained by shortening the length L of the laser light propagating direction of the birefringent crystal, or by use of a birefringent crystal 11 whose refractive index Δn is small.

The wavelength detection circuit 15 outputs to the laser drive control device 5 an optical signal output from the light receiving element for the first component 13, or that output from the light receiving element for the second component 14 as a wavelength-monitored signal. The laser drive control device 5 controls the oscillated wavelength of the semiconductor laser 2 by use of the thus output wavelength-monitored signal through a method later explained.

Figure 7:
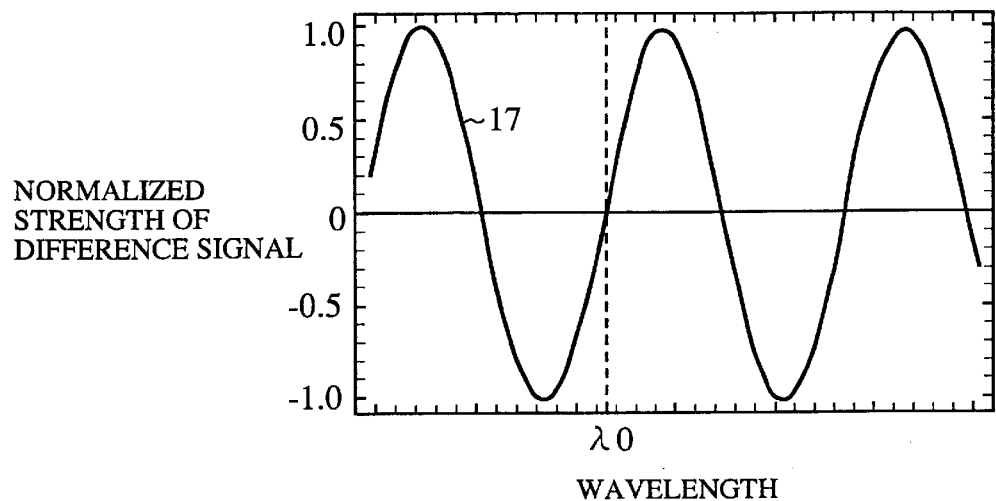
FIG. 7 is an illustration showing the frequency characteristics of a difference signal.

Further, a subtractor may be provided in the wavelength detection circuit 15, which outputs a difference value between the optical signal output from the light receiving element for the first component 13 and that output from the light receiving element for the second component 14 as a difference signal. Since the normalized strength of the difference signal varies depending on the wavelength of the laser light as shown in FIG. 7, if the wavelength λ0 is set as the reference wavelength, the wavelength detection circuit 15 can detect a change in the wavelength of the laser light varied from the reference wavelength. Further, since within the slope including the wavelength λ0, the wavelength is uniquely determined from the strength of the difference signal, the wavelength detection circuit 15 can also detect the absolute wavelength of the laser light from the strength of the difference signal. Since the amplitude of the strength of the difference signal is twice as high as that of the change in the strength of the optical signal of the received light, detection of a change in the strength of the laser light varied from the reference wavelength on the basis of a change in the strength of the difference signal is much more precise. By use of the difference signal, noise components in the same phases of the optical signal output from the light receiving element for the first component 13 and that output from the light receiving element for the second component 14 can be eliminated.

In this case, the wavelength detection circuit 15 outputs a difference signal to the laser drive control device 5 as a wavelength-monitored signal. The laser drive control device 5 controls the oscillated wavelength of the semiconductor laser 2 by use of the thus output wavelength-monitored signal through a method later explained.

Although the case in which the wavelength λ is taken as the reference wavelength has been explained heretofore, even in the case where a certain wavelength other than the wavelength λ0 is set to be the reference wavelength, the wavelength detection circuit 15 can detect the change in the wavelength of the laser light varied from the reference wavelength on the basis of the change in the strength of the optical signal of the received light or the change in the difference signal. Further, when a suitable offset voltage is applied to the difference signal so as to adjust an arbitrary wavelength to be the one at which the strength of the difference signal becomes zero, then the thus obtained wavelength signal can be set as a reference wavelength.

Further, an adder may be provided in the wavelength detection circuit 15, which outputs the total value of the optical signal output from the light receiving element for the first component 13 and that output from the light receiving element for the second component 14 as a sum signal. In the above-explained wavelength detection circuit 15, the change in the wavelength of the laser light varied from the reference wavelength is detected on the basis of the change in the strength of the optical signal of the received light or the change in the difference signal, and also the absolute wavelength is detected on the basis of the strength of the optical signal of the received light or the difference signal. However, as the strength of the optical signal or of the difference signal varies when the emission strength of the semiconductor laser 2 changes, variation of the emission strength of the semiconductor laser 2 should be made small. The strength of the sum signal does not change depending on the wavelength, but changes depending on the emission strength of the semiconductor laser 2, so that the wavelength detection circuit 15 can detect the variation of the emission strength of the semiconductor laser 2 on the basis of the change in the strength of the sum signal.

In this case, the wavelength detection circuit 15 can output the optical signal of the received light or the difference signal, as well as the sum signal, to the laser drive control device 5 as a wavelength-monitored signal. The laser drive control device 15 can make the emission strength of the semiconductor laser 2 constant by adjusting the input current to the semiconductor laser 2 by use of the sum signal, and can also control the oscillated wavelength of the semiconductor laser 2 by use of the wavelength-monitored signal on the basis of a method later explained.

Further, in addition to the above-explained adder, a divider for outputting the ratio of the received optical signal to the sum signal as a quotient signal may also be provided to the wavelength detection circuit 15. Further, a divider for outputting the ratio of the difference signal to the sum signal as a quotient signal may also be provided in addition to the above-explained subtractor and the adder. Since the value of the quotient signal does not vary even when the emission strength of the semiconductor laser 2 varies, the wavelength detection circuit 15 can detect a change in the wavelength of the laser light varied from the reference wavelength on the basis of the change in the value of the quotient signal in high precision, even without depending on the variation of the emission strength of the semiconductor laser 2. Still further, in one of the slopes out of the wavelength characteristics of the quotient signal, since the wavelength is uniquely determined based on the value of the quotient signal, the wavelength detection circuit 15 can detect in high precision the absolute wavelength of the laser light irrespectively of the variation of the emission strength of the semiconductor laser 2.

In this case, the wavelength detection circuit 15 outputs the quotient signal to the laser drive control device 5 as a wavelength-monitored signal. The laser drive control device 5 can control the oscillated wavelength of the semiconductor laser 2 by use of the wavelength-monitored signal through a method later explained.

Further, when providing the above-mentioned subtractor to the wavelength detection circuit 15, a first gain adjuster for adjusting the strength of the optical signal output from the light receiving element for the first component 13, and a second gain adjuster for adjusting the strength of the optical signal output from the light receiving element for the second component 14 can also be provided. In this case, by adjusting the wavelength to a certain arbitrary wavelength at which the strength of the difference signal becomes zero through adjustment of the gain of either one or both of the first gain adjuster and the second gain adjuster, the thus adjusted wavelength can be set as a reference wavelength.

The laser drive control device 5 controls the oscillated wavelength of the semiconductor laser 2 by use of the wavelength-monitored signal fed from the wavelength detection circuit 15. The oscillated wavelength of the semiconductor laser 2 can be controlled by adjusting the input current to the semiconductor laser 2. Generally, when the input current is increased to raise the output of the semiconductor laser 2, the oscillated wavelength of the semiconductor laser 2 is made longer.

Further, the oscillated wavelength of the semiconductor laser 2 can be controlled by adjusting the temperature of the semiconductor laser 2. Generally, the oscillated wavelength of the semiconductor laser 2 is made longer by raising the temperature.

In the case where the semiconductor laser whose length of the resonator is adjustable is used, the oscillated wavelength of the semiconductor laser 2 can be controlled by adjusting the length of the resonator. Generally, the oscillated wavelength can be limited only to the wavelength established within the resonator. The length of the resonator of the semiconductor laser 2 is adjusted by applying an electric field to the crystal configuring the semiconductor laser 2 and changing the refraction index of the crystal.

Further, in the case where a semiconductor laser in which a diffraction grating is employed as a resonance means is used, the oscillated wavelength of the semiconductor laser 2 can be adjusted by adjusting the periodic cycle of the diffraction grating. The diffraction grating selectively reflects only the wavelength specified corresponding to that cycle.

The method for adjusting the wavelength monitoring device 4 is explained below.

When the oscillation of the laser light is of the reference wavelength, first the birefringent crystal 11 is rotatably inclined about an axis perpendicular to the direction (namely z-axis direction) in which laser light is propagating, so that the strength of the optical signal output from the light receiving element for the first component 13 and that output from the light receiving element for the second component 14 are made equal.

When the inclined angle of the birefringent crystal 11 is changed, the length L of the propagating direction of the laser light within the birefringent crystal 11, namely the propagating distance of the laser light within the birefringent crystal 11 is changed, and thus the refractive index in the directions of the fast axis and of the slow axis, so that the wavelength characteristics of the received optical signal and the difference signal are also changed. For this reason, by changing the inclination angle of the birefringent crystal 11, the wavelength at which the strength of the optical signal output from the light receiving element for the first component 13 and that output from the light receiving element for the second component 14 are made equal can be adapted to match the reference wavelength.

In the case where the wavelength at which the strength of the optical signal output from the light receiving element for the first component 13 and that output from the light receiving element for the second component 14 are made equal is set to be the reference wavelength, the reference wavelength resides in the center portion of the slope within the wavelength characteristic of the optical signal or that of the difference signal. Due to this, a change in the wavelength of the laser light varied from the reference wavelength can be detected in a wide range.

Next, what an error in the processing of the birefringent crystal can affect the FSR is explained below.

Among the components of the wavelength stabilizing light source 1, the component that requires the most accurate processing is the birefringent crystal 11. When an error in the processing of the birefringent crystal 11 occurs, the wavelength characteristics of the optical signal or that of the difference signal also changes and thus the length of the laser light propagating direction L of the birefringent crystal 11 changes, and in this case, the change in the FSR will be represented as the following formulae (4) and (5).

$$\frac{\partial FSR}{\partial L} = -\frac{c_0}{\Delta n L^2} \quad (4)$$

$$\frac{\partial FSR}{\partial L} = -\frac{FSR}{L} \quad (5)$$

The FSR of the normal Etalon filter equals to a value obtained by replacing the values of $\Delta n$ and L in the before-mentioned formula (3) respectively with the refraction index n of the Etalon filter and the length L of the propagating direction of the laser light of the Etalon filter. For this reason, in the case of the Etalon filter as well, a change in the FSR when the length L of the laser light propagating direction has varied will be represented as the formula (5).

Generally, the value of the refraction index n of many isotropic crystals and anisotropic crystals is about 1, and the value of the refraction index $\Delta n$ of anisotropic crystals is one or two units smaller than the value of n. For this reason, if the FSR is same, the length L of the propagating direction of the laser light of the birefringent crystal 11 is longer than the length L of the propagating direction of the laser light of the Etalon filter.

Here, the change in the FSR in the case of the birefringent crystal and that in the case of the usual Etalon filter are compared, with reference to the formula (5) in the case of the same FSR. The numerator is same, but the denominator is larger in the case of the birefringent crystal 11 than in the case of the Etalon filter. Due to this, the change in the FSR is smaller in the case of the birefringent crystal 11 than in the case of the Etalon filter, whereas the processing precision can be made rougher in the case of the birefringent crystal 11 than in the case of the Etalon filter.

As explained heretofore, according to the present first embodiment, since signals having different wavelength characteristics can be obtained by use of only one birefringent crystal, one polarizer, and two light receiving elements, the number of components to be used is small, and thus the device can be made small as a whole.

Further, according to this embodiment, since signals having different wavelength characteristics can be obtained by use of only one birefringent crystal, there is no need to consider the change in the characteristic of each crystal generated when many crystals are used, so that wavelength monitoring and wavelength stabilization in high precision are made possible.

Further, according to this first embodiment, since only one polarizer is used, the directions in which the laser light is propagated are only two, whereby the alignment thereof can be facilitated.

Still further, according to the first embodiment, since the number of components used within the wavelength monitoring device 4 is small and subsequently the wavelength monitoring device 4 can be made small as a whole, the semiconductor laser 2, the optical lens 3, the wavelength monitoring device 4 and the laser drive control device 5 can be stored in one module, so that thus the wavelength stabilizing light source 1 can be packaged.

Still further, according to this first embodiment, since monitoring and stabilization of wavelength in high precision are made possible, a plurality of optical signals in which the mutual difference between individual wavelengths is small can be transmitted in one optical fiber without interfering adjacent optical signals, by use of a plurality of wavelength stabilizing light sources 1 having different oscillated wavelengths from each other. Due to this, a transmission system having a plurality of frequencies of base band signals can be configured by use of a plurality of wavelength stabilizing light sources 1 having different oscillated wavelengths from each other and one or more than one optical fibers.

Note that the first embodiment has been explained as to the case where the direction of the fast axis of the birefringent crystal 11 is inclined for 45 degrees with respect to the polarizing direction of the laser light. However, two kinds of optical signals having different characteristics from each other can be equally obtained even in the case where the direction of the fast axis of the birefringent crystal 11 is inclined for a certain degree other than the above 45 degrees. It should be noted, however, that the amplitude of the change in the strength of the received optical signal output from the light receiving element for the first component and that from the light receiving element for the second component are made equal in the case of the above 45-degree inclination.

Still further, the first embodiment has been explained as to the case where the laser light is of a rectilinear polarization. However, two kinds of optical signals having different characteristics from each other can be equally obtained even in the case where a laser light whose polarization type is other than the rectilinear polarization is input to the birefringent crystal 11.

Still further, the first embodiment has been explained as to the case where a collimated laser light is input to the birefringent crystal 11. However, two kinds of optical signals having different characteristics from each other can be equally obtained even in the case where an non-collimated laser light is input to the same.

Still further, according to this first embodiment, the birefringent crystal 11, the polarizer 12, and the laser light receiving-side and output-side surfaces of the light receiving element for the first component and those of the light receiving element for the second component may all be inclined with respect to the propagating direction of the laser light, and in this case, there will be no light beam reflected on the surfaces and returned to the semiconductor laser 2, so that the operation of the wavelength stabilizing light source 1 is made stable.

Yet still further, according to this first embodiment, a transmission means such as a polarized wave preserving fiber may be provided between the semiconductor laser 2 and the wavelength monitoring device 4, and in this case, the wavelength monitoring device 4 can be used independently by drawing the laser light emitted from the semiconductor laser 2 up to the wavelength monitoring device 4.

[Second Embodiment]

Figure 8:
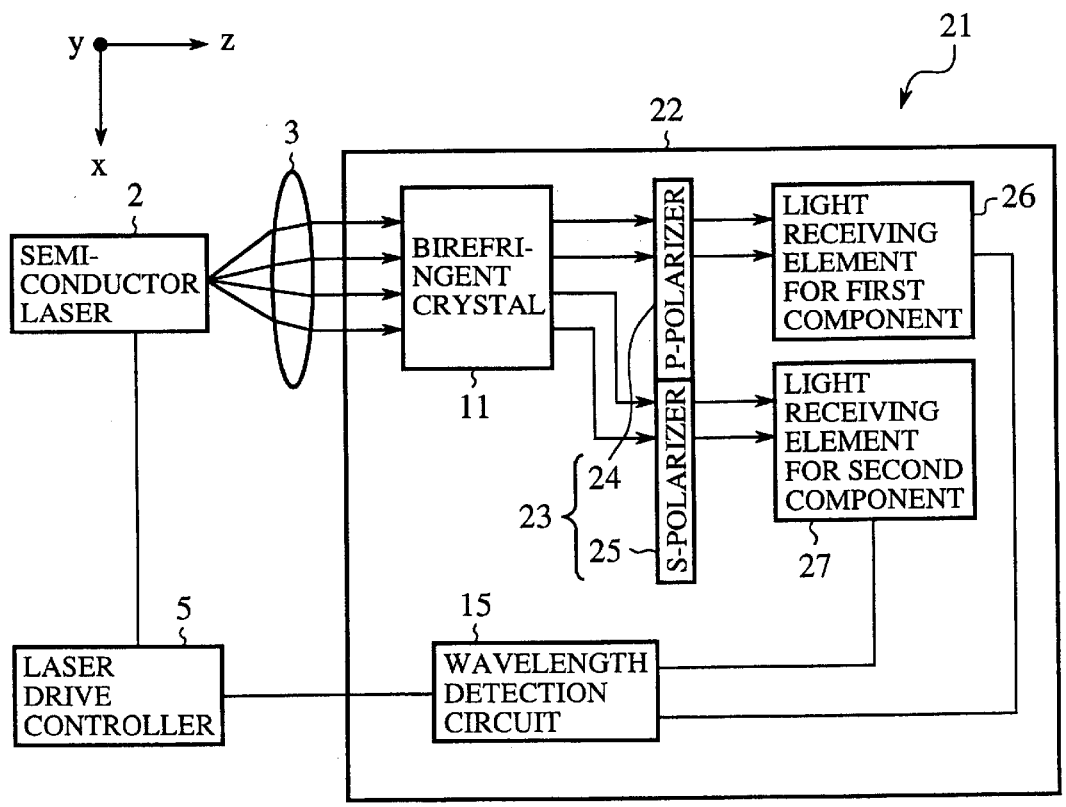
FIG. 8 is a schematic diagram showing the wavelength monitoring device and the wavelength stabilizing light source according to the second embodiment of the present invention.

FIG. 8 is a schematic diagram showing a wavelength monitoring device and a wavelength stabilizing light source according to a second embodiment of the present invention. In the figure, reference numeral 21 denotes a wavelength stabilizing light source, numeral 22 denotes a wavelength monitoring device, which inputs a p-polarized laser light that is emitted from the semiconductor laser 2 and collimated by the optical lens 3, monitors the wavelength of the thus input laser light, and finally sends it out as a wavelength-monitored signal, numeral 23 denotes a two-quadrant polarizer; (polarized light separating means), which is composed of a p-polarizer 24 (first area) for transmitting the p-polarized light and an s-polarizer 25 (second area) for transmitting the s-polarized light, wherein a half the laser light transmitted through the birefringent crystal 11 is input to the p-polarizer 24 for letting the p-polarized component transmitted, while the other half of the laser light transmitted through the birefringent crystal 11 is input to the s-polarizer 25 for letting the s-polarized component transmitted, thereby to separate the p-polarized component and the s-polarized component, numeral 26 denotes a light receiving element for the first component (light receiving means for the first component) for receiving the p-polarized component transmitted through the p-polarizer 24 of the two-quadrant polarizer 23, and outputs an optical signal corresponding to the strength of the received light, numeral 27 denotes a light receiving element for the second component (light receiving means for the second component) for receiving the s-polarized component transmitted through the s-polarizer 25 of the two-quadrant polarizer 23, and outputs an optical signal corresponding to the strength of the received light. Other components are same as or similar to those referenced by the same numerals in FIG. 13.

In this second embodiment, the light receiving means for the first component 26 and the light receiving means for the second component 27 are provided for composing the polarized light receiving means. In addition, there are two types of polarized light selecting and receiving means, one of which is composed of the 2-quadrant polarizer 23 and the light receiving element for the first component 26, while the other is composed of the 2-quadrant polarizer 23 and the light receiving element for the second component 27.

The 2-quadrant polarizer 23 is constructed in such a manner that one side surface of the p-polarizer 24 is firmly attached to one side surface of the s-polarizer 25, wherein one half area of the open surface of the 2-quadrant polarizer 23 is occupied by the p-polarizer 24, whereas the other half area of the open surface of the 2-quadrant polarizer 23 is occupied by the s-polarizer 25. In this construction, one half area of the sectional surface of the laser light transmitted through the birefringent crystal 11 is input to the p-polarizer 24, while the other half of the laser light transmitted through the birefringent crystal 11 is input to the s-polarizer 25. Due to this, one half area of the sectional surface of the laser light transmitted through the 2-quadrant polarizer 23 is only the p-polarized component, while the other half area is only the s-polarized component. The light receiving element for the first component 26 and the light receiving element for the second component 27 are disposed in parallel such that the p-polarized component transmitted through the p-polarizer 24 is received by the light receiving element for the first component 26, and the s-polarized component transmitted through the s-polarizer 25 is received by the light receiving element for the second component 27.

In this second embodiment, the laser light transmitted through the birefringent crystal 11 is separated into the p-polarized component and the s-polarized component by the 2-quadrant polarizer 23. The p-polarized component is received by the light receiving element for the first component 26, while the s-polarized component is received by the light receiving element for the second component 27. For this reason, the device of this embodiment functions just as the case of the first embodiment.

As explained above, according to the second embodiment, the same effects as those of the first embodiment can be obtained.

Further according to the second embodiment, since the laser light transmitted through the birefringent crystal 11 is separated into the p-polarized component and the s-polarized component by the 2-quadrant polarizer 23, the direction in which the laser light advances is only one, so that the alignment thereof can be facilitated.

Further, according to the second embodiment, since the light receiving element for the first component 26 and the light receiving element for the second component 27 are disposed in parallel, the device is made small as a whole.

Note that the 2-quadrant polarizer 23 may be provided directly to the light-emitting-side surface of the birefringent crystal 11 so as to integrate these two components, and by doing so, the number of components to be used is reduced, and the alignment thereof can be facilitated.

Still further, the same effect can be obtained even when a polarized light selecting and receiving means provided with a p-polarized light separating layer for transmitting the p-polarized component and reflecting or absorbing the s-polarized component is used, instead of the polarized light selecting and receiving means configured by the 2-quadrant polarizer 23 and the light receiving element for the first component 26, or even when a polarized light selecting and receiving means provided with a s-polarized light separating layer for transmitting the s-polarized component and reflecting or absorbing the p-polarized component is used, instead of the polarized light selecting and receiving means configured by the 2-quadrant polarizer 23 and the light receiving element for the second component 27.

[Third Embodiment]

Figure 9:
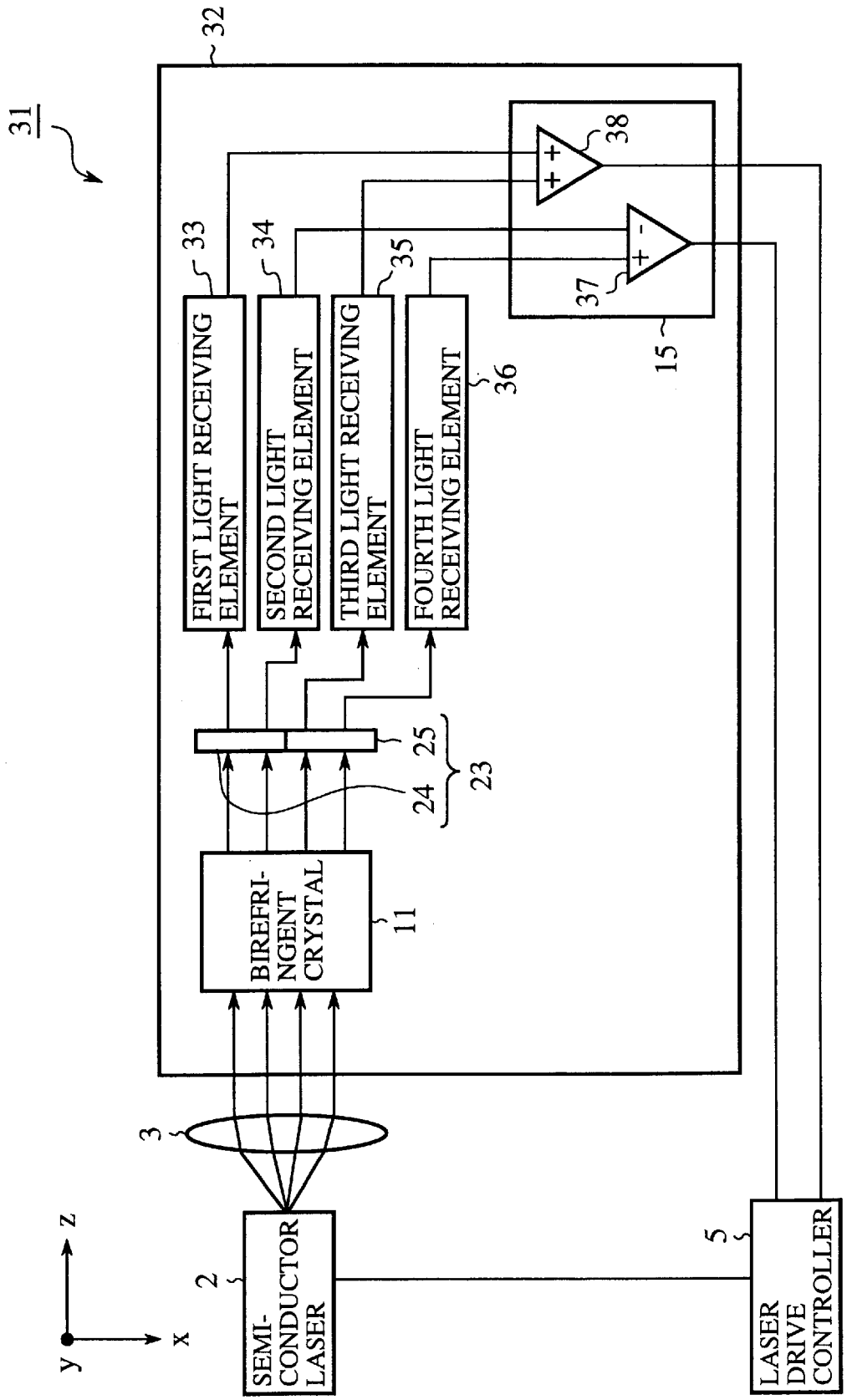
FIG. 9 is a schematic diagram showing the wavelength monitoring device and the wavelength stabilizing light source according to the third embodiment of the present invention.

FIG. 9 is a schematic diagram showing a wavelength monitoring device and a wavelength stabilizing light source according to a third embodiment of the present invention. In the figure, reference numeral 31 denotes a wavelength stabilizing light source, numeral 32 denotes a wavelength monitoring device, which inputs a p-polarized laser light that is emitted from the semiconductor laser 2 and collimated by the optical lens 3, monitors the wavelength of the thus input laser light, and finally sends it out as a wavelength-monitored signal, numerals 33 and 34 denote a first and a second light receiving elements for receiving the p-polarized component transmitted through the p-polarizer 24 of the 2-quadrant polarizer 23 and outputting an optical signal corresponding to the strength of the received light, numerals 35 and 36 denote a third and a fourth light receiving elements for receiving the s-polarized component transmitted through the s-polarizer 25 of the 2-quadrant polarizer 23 and outputting an optical signal corresponding to the strength of the received light, numeral 37 denotes a subtractor, which is provided in the wavelength detection circuit 15 and outputs the difference between the optical signal output from the second light receiving element 34 and that output from the fourth light receiving element 36 as a difference signal, whereas numeral 38 denotes an adder, which is provided in the wavelength detection circuit 15 and outputs the sum of the optical signal output from the first light receiving element 33 and that output from the third light receiving element 35 as a sum signal. Other components are same as or similar to those referenced by the same numerals in FIGS. 3 and 8.

In this third embodiment, the first and the second light receiving elements 33 and 34 are provided as a light receiving means for the first component, whereas the third and the fourth light receiving elements 35 and 36 are provided as a light receiving means for the second component.

The first to fourth light receiving elements 33 to 36 are disposed in parallel for receiving the p-polarized component transmitted through the p-polarizer 24 by the first and the second light receiving elements 33 and 34, and for receiving the s-polarized component transmitted through the s-polarizer 25 by the third and the fourth light receiving elements 35 and 36.

According to the third embodiment, the laser light transmitted through the birefringent crystal 11 is separated into the p-polarized component and the s-polarized component by the 2-quadrant polarizer 23. The p-polarized component is received by the first and the second light receiving elements 33 and 34, whereas s-polarized component is received by the third and the fourth light receiving elements 35 and 36. The difference between the optical signal output from the second light receiving element 34 and that output from the fourth light receiving element 36 is output from the subtractor 37 as a difference signal, and the sum of the optical signal output from the first light receiving element 33 and that output from the third light receiving element 35 is output from the adder 38 as a sum signal. Thus, the device of this embodiment functions just as the case of the first embodiment.

As explained above, the same effect as that obtained by the second embodiment can be obtained by this third embodiment.

Further, according to the third embodiment, since the p-polarized component transmitted through the p-polarizer 24 of the 2-quadrant polarizer 23 is received by the first and the second light receiving elements 33 and 34, and the s-polarized component transmitted through the s-polarizer 25 of the 2-quadrant polarizer 2 is received by the third and a fourth light receiving elements 35 and 36, the difference signal and the sum signal can be readily obtained.

Note that the first to fourth light receiving elements may be disposed on the same base element, and in this case, the number of components used therein is reduced, and thus the alignment thereof can also be facilitated.

Further, this third embodiment has been explained as a modified case of the second embodiment in which the p-polarized component and the s-polarized component are separated by the 2-quadrant polarizer 23. However, it may be constructed as a modified case of the first embodiment for acquiring the same effect in which the p-polarized component and the s-polarized component are separated by the polarizer 12. Note that in this latter case, however, it should be arranged such that as to the first to fourth light receiving elements 33 to 36, the p-polarized component transmitted through the polarizer 12 is received by the first and the second light receiving elements 33 and 34, whereas the s-polarized component reflected by the polarizer 12 is received by the third and the fourth light receiving elements 35 and 36.

[Fourth Embodiment]

Figure 10:
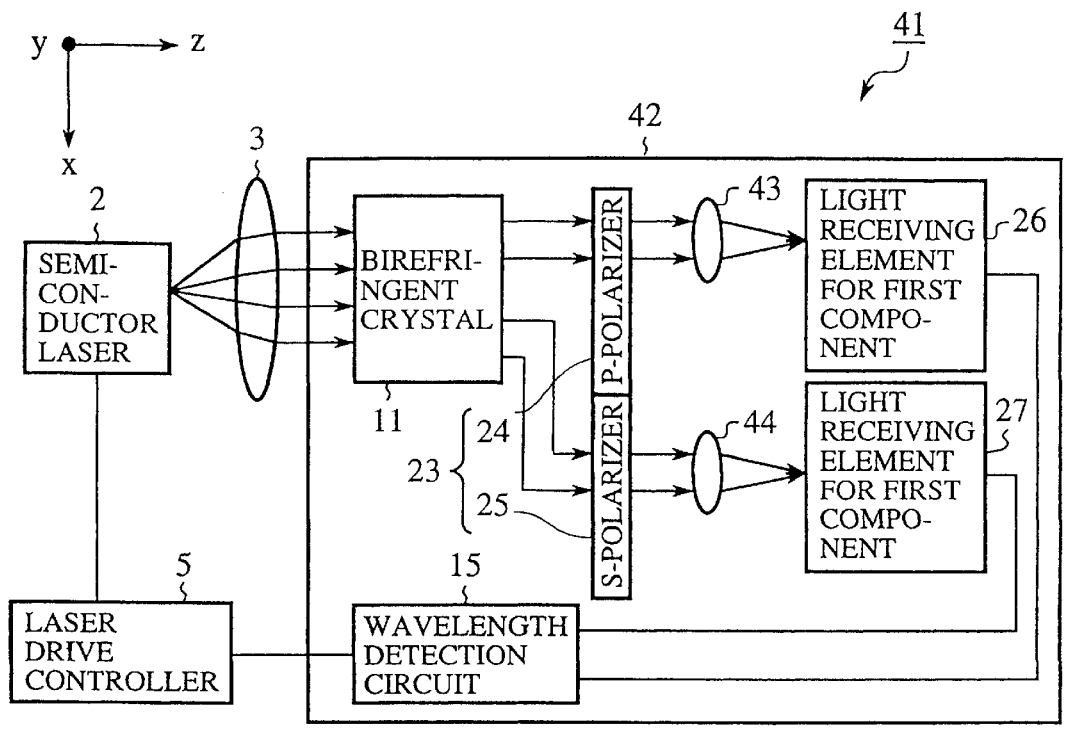
FIG. 10 is a schematic diagram showing the wavelength monitoring device and the wavelength stabilizing light source according to the fourth embodiment of the present invention.

FIG. 10 is a schematic diagram showing a wavelength monitoring device and a wavelength stabilizing light source according to a fourth embodiment of the present invention. In the figure, reference numeral 41 denotes a wavelength stabilizing light source, numeral 42 denotes a wavelength monitoring device, which inputs a p-polarized laser light that is emitted from the semiconductor laser 2 and collimated by the optical lens 3, monitors the wavelength of the thus input laser light, and finally sends it out as a wavelength-monitored signal, reference numeral 43 denotes a first condensing lens (condenser means), which is disposed between the p-polarizer 24 of the 2-quadrant polarizer 23 and the light receiving element for the first component 26 for condensing the p-polarized component transmitted through the p-polarizer 24 of the 2-quadrant polarizer 23 on to the light receiving element for the first component 26, numeral 44 denotes a second condensing lens (condenser means), which is disposed between the s-polarizer 25 of the 2-quadrant polarizer 23 and the light receiving element for the second component 27 for condensing the s-polarized component transmitted through the s-polarizer 25 of the 2-quadrant polarizer 23 on to the light receiving element for the second component 27. Other components are same as or similar to those referenced by the same numerals in FIGS. 3 and 8.

In this fourth embodiment, the laser light transmitted through the birefringent crystal 11 is separated into the p-polarized component and the s-polarized component by the 2-quadrant polarizer 23. The p-polarized component condensed by the first condensing lens 43 is received by the light receiving element for the first component 26, whereas s-polarized component condensed by the second condensing lens 44 is received by the light receiving element for the second component 27. Thus, the device of this embodiment functions just as the case of the first embodiment.

As explained above, the same effect as that obtained by the second embodiment can be obtained by this fourth embodiment.

Further, according to the fourth embodiment, the p-polarized component transmitted through the p-polarizer 24 of the 2-quadrant polarizer 23 is condensed on to the light receiving element for the first component 26 by use of the first condensing lens 43, and the s-polarized component transmitted through the s-polarizer 25 of the 2-quadrant polarizer 23 is condensed onto the light receiving element for the second component 27 by use of the second condensing lens 44. Due to this, the strength of the received light per light receiving unit area of the light receiving element for the first component 26 and that of the light receiving element for the second component 27 are increased, and thus an optical signal of high signal-to-noise ratio is obtained. Further, since the area of the open surface of the light receiving element for the first component 26 and that of the light receiving element for the second component 27 can be made small, the overall size of these light receiving element for the first component 26 and that of the light receiving element for the second component 27 is made small, and thus the device can be made small as a whole.

Further, the fourth embodiment has been explained as a modified case of the second embodiment in which the p-polarized element and the s-polarized component are separated by the 2-quadrant polarizer 23, wherein the p-polarized component is received by the light receiving element for the first component 26, and the s-polarized component is received by the light receiving element for the second component 27. However, it can be constructed as a modified case of the first embodiment for acquiring the same effect in which the p-polarized component is received by the light receiving element for the first component 13, and the s-polarized component is received by the light receiving element for the second component 14. In this case, the first condensing lens 43 should be disposed between the polarizer 12 and the light receiving element for the first component 13, and the second condensing lens 44 should be disposed between the polarizer 12 and the light receiving element for the second component 14. Further, the same effect can be obtained even in a modified case of the third embodiment wherein the p-polarized element and the s-polarized element are separated by the 2-quadrant polarizer 23, wherein the p-polarized component is received by the first and the second light receiving elements 33 and 34, and the s-polarized component is received by the third and the fourth light receiving elements 35 and 36. Note that in this latter case, however, it should be arranged such that four condensing lenses are disposed in parallel between the 2-quandrant polarizer 23 and the first to fourth light receiving elements 33 to 36.

[Fifth Embodiment]

Figure 11:
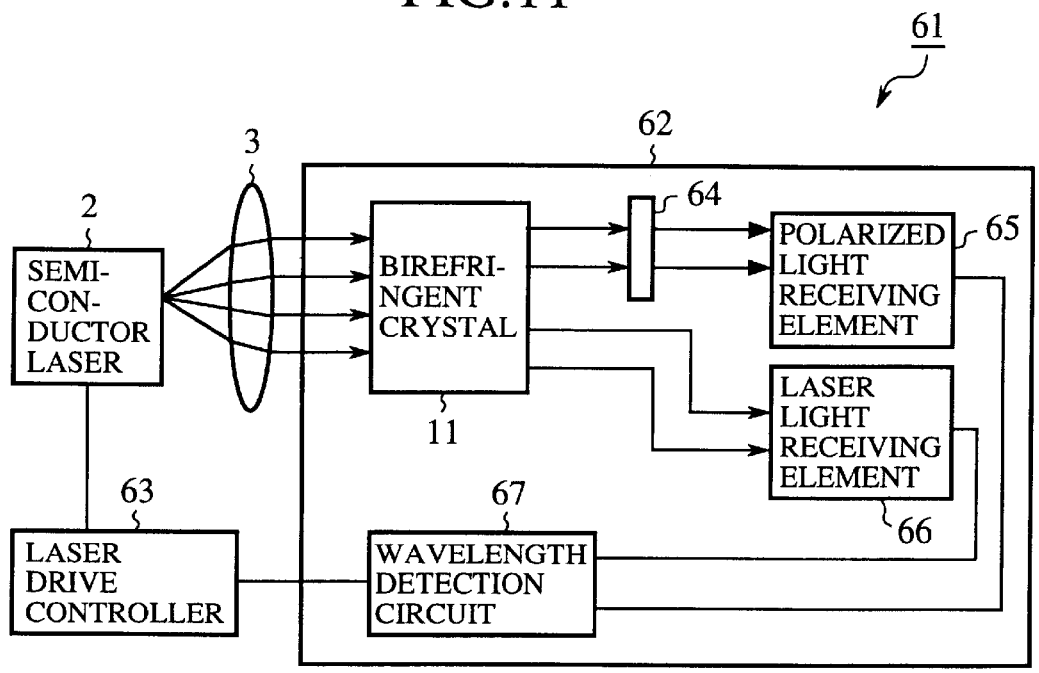
FIG. 11 is a schematic diagram showing the wavelength monitoring device and the wavelength stabilizing light source according to the fifth embodiment of the present invention.

FIG. 11 is a schematic diagram showing a wavelength monitoring device and a wavelength stabilizing light source according to a fifth embodiment of the present invention. In the figure, reference numeral 61 denotes a wavelength stabilizing light source, numeral 62 denotes a wavelength monitoring device, which inputs a p-polarized laser light that is emitted from the semiconductor laser 2 and collimated by the optical lens 3, monitors the wavelength and the strength of the laser light and finally outputs as a wavelength-monitored signal and a strength-monitored signal, reference numeral 63 denotes a laser drive control device, which is connected to the semiconductor laser 2 and controls the oscillated wavelength and the emission strength of the semiconductor laser 2 by use of the wavelength-monitored signal and the strength-monitored signal output from the wavelength monitoring device (an example of a wavelength detection configuration) 61, numeral 64 denotes a p-polarizer (polarized light separating means/configuration), which inputs one part of the laser light transmitted through the birefringent crystal 11 and extracts the p-polarized component by transmitting it therethrough, numeral 65 denotes a polarized light receiving element (polarized light receiving means/configuration) for receiving the laser light transmitted through the p-polarizer 64 and outputting an optical signal corresponding to the strength of the received light (polarized light receiving means/configuration), 66 denotes a laser light receiving element (laser light receiving means/configuration) for receiving the laser light, which has transmitted through the birefringent crystal 11 but has not passed through p-polarizer 64, and outputting an optical signal corresponding to the strength of the received light, numeral 67 denotes a wavelength detection circuit (wavelength detection means/configuration) connected to the laser drive control device 63 for monitoring the wavelength of the laser light input to the birefringent crystal 11 by use of an optical signal output from the polarized light receiving element 65, outputting it as a wavelength-monitored signal, and also monitoring the strength of the laser light input to the birefringent crystal 11 by use of an optical signal output from the laser light receiving element 66, and thereafter outputting it as a strength-monitored signal. Other components are same as or similar to those referenced by the same numerals in FIG. 3.

In this fifth embodiment, the polarized light selecting and receiving means is composed of the p-polarizer 64 and the polarized light receiving element 65. The strength detection means is configured by the wavelength detection circuit 67.

Next, the operation of the device is explained below.

One part of the laser light transmitted through the birefringent crystal 11 is input to the p-polarizer 64. The p-polarized component of the laser light input to the p-polarizer 64 is transmitted therethrough, and is received by the polarized light receiving element 65. The optical signal output from the polarized light receiving element 65 is input to the wavelength detection circuit 67. The strength of the optical signal output from the polarized light receiving element 65 varies just as the case of the first embodiment. For this reason, the wavelength detection circuit 67 can monitor the wavelength of the laser light by use of an optical signal output from the polarized light receiving element 65.

Further, one part of the laser light transmitted through the birefringent crystal 11 does not pass through the p-polarizer 64, but is directly received by the laser light receiving element 66 instead. The optical signal output from the laser light receiving element 66 is input to the wavelength detection circuit 67. The strength of the optical signal output from the laser light receiving element 66 does not depend on the wavelength, but varies in accordance with the emission strength of the semiconductor laser 2. For this reason, the wavelength detection circuit 67 can monitor the strength of the laser light emitted from the semiconductor laser 2 by use of the optical signal output from the laser light receiving element 66.

The wavelength detection circuit 67 outputs an optical signal output from the polarized light receiving element 65 to the laser drive control device 63 as a wavelength-monitored signal, and also outputs an optical signal output from the laser light receiving element 66 to the laser drive control device 63 as a strength-monitored signal. The laser drive control device 63 controls the oscillated wavelength and the emission strength of the semiconductor laser 2 by use of the wavelength-monitored signal and the strength-monitored signal output from the wavelength monitoring device 61.

Further, a divider for outputting the ratio of the optical signal output from the polarized light receiving element 65 to that output from the laser light receiving element 66 as a quotient signal can be provided in the wavelength detection circuit 67.

In this case, the wavelength detection circuit 67 outputs the quotient signal to the laser drive control device 63 as a wavelength-monitored signal. The laser drive control device 63 controls the oscillated wavelength of the semiconductor laser 2 by use of the wavelength-monitored signal.

As explained above, according to this fifth embodiment, both the wavelength and the strength of the laser light emitted from the semiconductor laser 2 can be monitored.

Note that the fifth embodiment has been explained as to the case where one part of the laser light transmitted through the birefringent crystal 11 is received by the laser light receiving element 66, but even in the case where one part of the laser light before transmitting through the birefringent crystal 11, namely, one part of the laser light immediately after it is emitted from the semiconductor laser 2 or transmitted through the optical lens 3 is received by the laser light receiving element 66, the strength of the laser light emitted from the semiconductor laser 2 can be monitored just as the above explained case.

Still further, the fifth embodiment has been explained as to the case where the p-polarizer 64 is used as a polarized light separating means, but even if an s-polarizer is used, the wavelength of the laser light can be monitored just as the case above.

Yet still further, the same effect can be obtained even when a polarized light selecting and receiving means provided with a p-polarized component separating layer that transmits the p-polarized component and reflects or absorbs the s-polarized component is used on the input-side surface of the polarized light receiving element 65, instead of the polarized light selecting and receiving means configured by the p-polarizer 64 and the polarized light receiving element 65.

[Sixth Embodiment]

Figure 12:
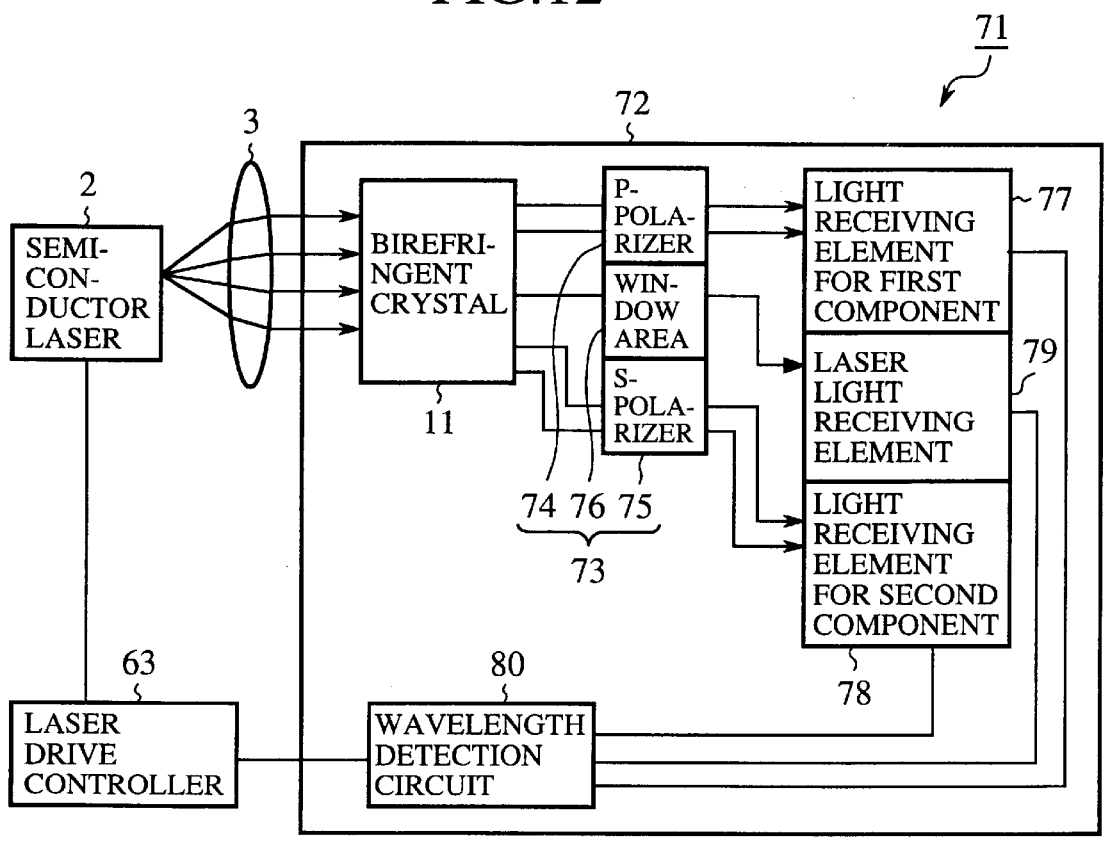
FIG. 12 is a schematic diagram showing the wavelength monitoring device and the wavelength stabilizing light source according to the sixth embodiment of the present invention.

FIG. 12 is a schematic diagram showing a wavelength monitoring device and a wavelength stabilizing light source according to a sixth embodiment of the present invention. In the figure, reference numeral 71 denotes a wavelength stabilizing light source, numeral 72 denotes a wavelength monitoring device, which inputs a p-polarized laser light that is emitted from the semiconductor laser 2 and collimated by the optical lens 3, monitors the wavelength and strength of the thus input laser light, and finally sends it out as a wavelength-monitored signal, reference numeral 73 denotes a laser light 3-dividing element (polarized light separating means), which is composed of a p-polarizer 74 (first area) for transmitting the p-polarized light, an s-polarizer 75 (second area) for transmitting the s-polarized light, and a window area 76 (third area) for transmitting the light without changing the polarization state thereof, numeral 77 denotes a light receiving element for the first component (light receiving means for the first component) for receiving the p-polarized component transmitted through the p-polarizer 74 of the laser light 3-dividing polarizer 73, and outputting an optical signal corresponding to the strength of the received light, 78 denotes a light receiving element for the second component (light receiving means for the second component) for receiving the s-polarized component transmitted through the s-polarizer 75 of the laser light 3-dividing polarizer 73, and outputting an optical signal corresponding to the strength of the received light, 79 denotes a laser light receiving element (laser light receiving means) for receiving the laser light transmitted through the window area 76 of the laser light 3-dividing polarizer 73, and outputting an optical signal corresponding to the strength of the received light, numeral 80 denotes a wavelength detection circuit (wavelength detection means) connected to the laser drive control device 63 for monitoring the wavelength of the laser light input to the birefringent crystal 11 by use of either one or both of the optical signal output from the polarized light receiving element for the first component 77 and that output from the polarized light receiving element for the second component 78, outputting it as a wavelength-monitored signal, and also monitoring the strength of the laser light input to the birefringent crystal 11 by use of an optical signal output from the laser light receiving element 79, and thereafter outputting it as a strength-monitored signal. Other components are same as or similar to those referenced by the same numerals in FIG. 3.

In this sixth embodiment, the light receiving means for the first component 77 and the light receiving means for the second component 78 are provided for composing the polarized light receiving means. In addition, there are two types of polarized light selecting and receiving means, one of which is composed of the laser light 3-dividing element 73 and the light receiving element for the first component 77, while the other is composed of the laser light 3-dividing element 73 and the light receiving element for the second component 78. The strength detection means is composed of the wavelength detection circuit 80.

The laser light 3-dividing element 73 is composed by applying a reduced reflection-reducing layer in the center portion of the 2-quadrant polarizer as explained in the second embodiment. The area to which the reflection-reducing layer is applied is the window area 76. The laser light 3-dividing element 73 is disposed such that one part of the laser light transmitted through the birefringent crystal 11 is input to the p-polarizer 74, while another part thereof is input to the window area 76 and still some other part thereof is input to the s-polarizer 75. The light receiving element for the first component 77 receives the p-polarized component transmitted through the p-polarizer 74, the laser light receiving element 79 receives the laser light transmitted through window area 76, and the light receiving element for the second component 78 receives the s-polarized component transmitted through the s-polarizer 75.

Next, the operation of the device is explained below.

One part of the laser light transmitted through the birefringent crystal 11 is input to the p-polarizer 74, while another part thereof is input to the s-polarizer 75. The p-polarized component of the laser light input to the p-polarizer 74 is transmitted through the p-polarizer 74, and is received by the light receiving element for the first component 77, while the s-polarized component of the laser light input to the s-polarizer 75 is transmitted through the s-polarizer 75, and is received by the light receiving element for the second component 78. The laser light received by the light receiving element for the first component 77 and that received by the light receiving element for the second component 78 are both input to the wavelength detection circuit 80. The strength of the optical signal output from the light receiving element for the first component 77 and that output from the light receiving element for the second component 78 vary just as the case of the first embodiment. Due to this, the wavelength detection circuit 80 is capable of monitoring the wavelength of the laser light by use of either one of or both of the optical signal output from the light receiving element for the first component 77 and the optical signal output from the light receiving element for the second component 78.

Further, still other part of the laser light transmitted through the birefringent crystal 11 is transmitted through the window area 76, and received by the laser light receiving element 79. The strength of the optical signal output from the laser light receiving element 79 does not depend on the wavelength, but varies in accordance with the emission strength of the semiconductor laser 2. For this reason, the wavelength detection circuit 80 is capable of monitoring the strength of the optical signal output from the semiconductor laser 2 by use of the optical signal output from the laser light receiving element 79.

A subtractor for outputting the difference between the optical signal output from the laser light receiving element for the first component 77 and the optical signal output from the laser light receiving element for the second component 78 as a difference signal can be provided in the wavelength detection circuit 80.

In this case, the wavelength detection circuit 80 outputs the difference signal to the laser drive control device 63 as a wavelength-monitored signal. The laser drive control device 63 controls the oscillated wavelength of the semiconductor laser 2 by use of the wavelength-monitored signal.

Further, a divider for outputting as a quotient signal the ratio of either the optical signal output from the laser light receiving element for the first component 77 or the optical signal output from the laser light receiving element for the second component 78 to the optical signal output from the laser light receiving element 79 can be provided in the wavelength detection circuit 80. It can also be arranged such that in addition to the subtractor, a divider for outputting the ratio of the optical signal output from the laser light receiving element 79 to the difference signal as a quotient signal can also be provided in the wavelength detection circuit 80.

In this case, the wavelength detection circuit 80 outputs the quotient signal to the laser drive control device 63 as a wavelength-monitored signal. The laser drive control device 63 controls the oscillated wavelength of the semiconductor laser 2 by use of the wavelength-monitored signal.

As explained above, according to this sixth embodiment, both the wavelength and the strength of the laser light emitted from the semiconductor laser 2 can be monitored.

Further, according to the sixth embodiment, as the direction in which the laser light advances is made only one direction, the alignment thereof is facilitated.

Still further, according to this embodiment, since the light receiving element for the first component 77, the light receiving element for the second component 78 and the laser light receiving element 79 are disposed in parallel to one another, the total size of the device is made small as a whole.

Note that it may be further arranged such that the laser light 3-dividing element 73 is provided on the output-side surface of the birefringent crystal 11, and the birefringent crystal 11 is integrally formed with the laser light 3-dividing element 73. In this case, the number of components used therein is reduced, so that the alignment thereof is facilitated.

[Seventh Embodiment]

Figure 13:
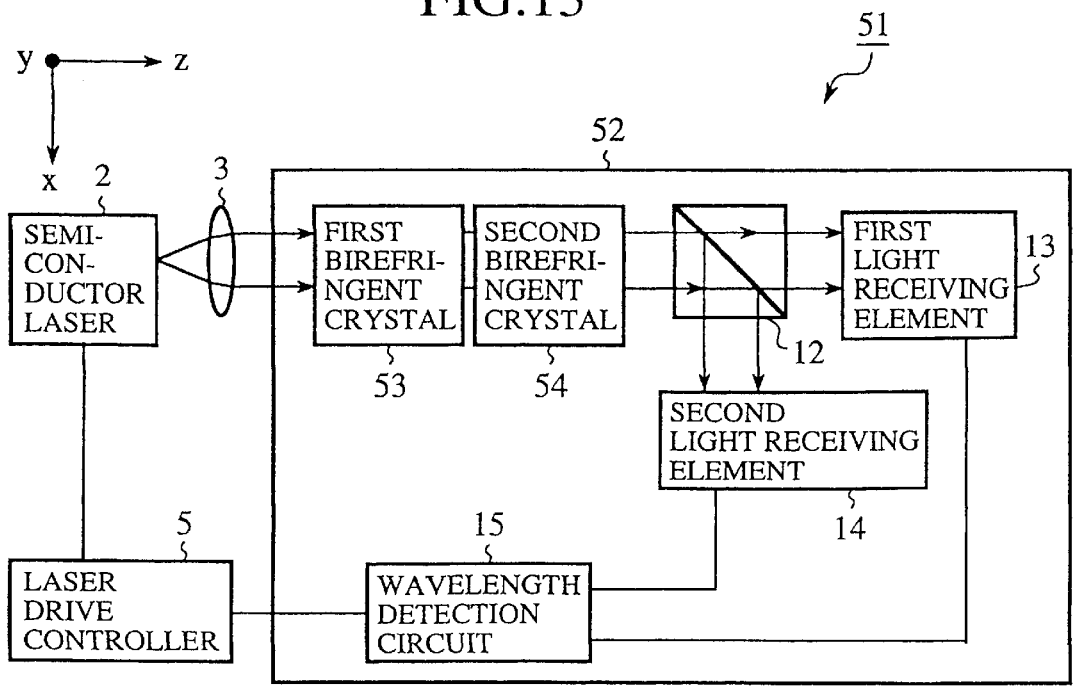
FIG. 13 is a schematic diagram showing the wavelength monitoring device and the wavelength stabilizing light source according to the seventh embodiment of the present invention.

FIG. 13 is a schematic diagram showing a wavelength monitoring device and a wavelength stabilizing light source according to a seventh embodiment of the present invention. In the figure, reference numeral 51 denotes a wavelength stabilizing light source, numeral 52 denotes a wavelength monitoring device, which inputs a p-polarized laser light that is emitted from the semiconductor laser 2 and collimated by the optical lens 3, monitors the wavelength and strength of the thus input laser light, and finally sends it out as a wavelength-monitored signal, reference numeral 53 denotes a first birefringent crystal for inputting the p-polarized laser light, which is emitted from the semiconductor laser 2 and collimated by the optical lens 3, and changes the polarization state of the laser light according to its wavelength after it is transmitted therethrough, numeral 54 denotes a second birefringent crystal for inputting the laser light transmitted through the first birefringent crystal 53, and changes the polarization state of the laser light according to the wavelength after it is transmitted therethrough. Other components are same as or similar to those referenced by the same numerals in FIG. 3. In this embodiment, the polarization state changing means is configured by the first and the second birefringent crystals 53 and 54.

The second birefringent crystal 54 is disposed in such a manner as to offset the discrepancy of the shifted value δ caused by a change in the difference of the refractive index of the first birefringent crystal 53 and by a change in the length of the propagating direction of the laser light.

If the change in the difference of the refractive index $\Delta n_A$ of the first birefringent crystal 53 $d\Delta n_A/dT$ and the change in the difference of the refractive index $\Delta n_B$ of the second birefringent crystal 54 $d\Delta n_B/dT$ due to a temperature change are both positive values or negative values, the second birefringent crystal 54 is disposed such that the first F axis direction of the first birefringent crystal 53 and the slow S axis direction of the second birefringent crystal 54 coincide with each other, and the slow S axis direction of the first birefringent crystal 53 and the fast F axis direction of the second birefringent crystal 54 coincide with each other. On the other hand, if either one of $d\Delta n_A/dT$ and $d\Delta n_B/dT$ is a positive value, while the other one is a negative value, the second birefringent crystal 54 is disposed in such a manner that the first F axis direction of the first birefringent crystal 53 and the fast F axis direction of the second birefringent crystal 54 coincide with each other, and the slow S axis direction of the first birefringent crystal 53 and the slow S axis direction that of the second birefringent crystal 54 coincide with each other.

In the case where the second birefringent crystal 54 is disposed such that the first F axis direction of the first birefringent crystal 53 and the slow S axis direction of the second birefringent crystal 54 coincide with each other, the FSR can be represented by the formula (6). On the other hand, in the case where the second birefringent crystal 54 is disposed such that the first F axis direction of the first birefringent crystal 53 and the fast F axis direction of the second birefringent crystal 54 coincide with each other, and further the slow S axis direction of the first birefringent crystal 53 and the slow S axis direction of the second birefringent crystal 54 coincide with each other, the FSR can be represented by the formula (7). Here, the value $L_A$ indicates the length of the propagating direction of the laser light of the first birefringent crystal 53, whereas the value $L_B$ indicates the length of the propagating direction of the laser light of the second birefringent crystal 54.

$$FSR = \frac{c_0}{(\Delta n_A \cdot L_A + \Delta n_B \cdot L_B)} = \frac{\lambda^2}{(\Delta n_A \cdot L_A + \Delta n_B \cdot L_B)} \quad (6)$$

$$FSR = \frac{c_0}{(\Delta n_A \cdot L_A - \Delta n_B \cdot L_B)} = \frac{\lambda^2}{(\Delta n_A \cdot L_A - \Delta n_B \cdot L_B)} \quad (7)$$

If the total sum of the number of loop or nodes of a laser light propagating within the first and the second birefringent crystals 53 and 54 is m, then the wavelength λ of the laser light is represented by the following formula (8).

$$\lambda = \frac{(\Delta n_A \cdot L_A + \Delta n_B \cdot L_B)}{m} \quad (8)$$

When the value m in the formula (8) is deleted through differentiation, taking the temperature as a variable, then it can be represented as the formula (9) shown below. The formula (9) indicates a change in the reference wavelength generated due to a temperature change.

$$\frac{\partial \lambda}{\partial T} = \left\{ \left( \frac{d\Delta n_A}{dT} + \alpha_A \cdot \Delta n_A \right) \cdot L_A + \left( \frac{d\Delta n_B}{dT} + \alpha_B \cdot \Delta n_B \right) \cdot L_B \right\} \cdot \quad (9)$$
$$\lambda / (\Delta n_A \cdot L_A + \Delta n_B \cdot L_B)$$

In this case, if the first and the second birefringent crystals 53 and 54 are processed in such a manner that $L_A$ and $L_B$ satisfy the formula (10), then the right member of the formula (9) becomes zero, and there is no occurrence of change in the reference wavelength due to a temperature change.

$$\left( \frac{d\Delta n_A}{dT} + \alpha_A \cdot \Delta n_A \right) \cdot L_A + \left( \frac{d\Delta n_B}{dT} + \alpha_B \cdot \Delta n_B \right) \cdot L_B = 0 \quad (10)$$

Further, if the first and the second birefringent crystals 53 and 54 are processed in such a manner that $L_A$ and $L_B$ satisfy the formula (10), and also satisfies the formulae (6) and (7) in which a desired value is substituted for the FSR, then there is no occurrence of change in the reference wavelength due to a temperature change, and the FSR becomes the desired value.

As explained above, when constructing a polarization state changing means by the first and the second birefringent crystals, first materials for these crystals should be selected in such a manner that the difference of refraction index therebetween, the variation of the difference of refraction indexes due to a temperature change, and the linear expansion coefficients thereof become predetermined values. Then, the position of the first and the second birefringent crystals should be determined according to the value of a change in the difference between the refraction index of the first birefringent crystal and that of the second birefringent crystal due to a temperature change. Thereafter, the lengths of the propagating direction of the laser light of the first and the second birefringent crystals are determined in such a manner that the FSR becomes a desired value.

It is to be noted that in the case where a crystal whose $\Delta n_A$ is large is used for the first birefringent crystal 53, and a crystal whose $\Delta n_B$ is small is used for the second birefringent crystal 54, the value of the denominator $\Delta n_B \cdot L_B$ in the formulae (6) and (7) is made small, and as $\Delta n_A$ is large, the value of the $L_A$ required for obtaining the same FSR may be a small value. Due to this, the first birefringent 53 is made small, enabling a small-sized device as a whole.

As a preferred example of the combination of the first birefringent crystal 53 and the second birefringent crystal 54, the combination of a $YVO_4$ crystal as the first birefringent crystal 53 and a $LiNbo_3$ crystal as the second birefringent crystal 54 can be considered. In this combination, $d\Delta n_A/dT$ and $d\Delta n_B/dT$ are both negative values. If the values of $L_A$ and $L_B$ are obtained from the formulae (7) and (10), on condition that the FSR is 800 GHz (6.4 nm), then $L_A$=0.9725 mm, and $L_B$=0.1494 mm. In this case, other values should be; $\Delta n_A$=0.2039, $\Delta n_B$=0.0731, $d\Delta n_A/dT$=−5.5 [×$10^{-6}$/K], $d\Delta n_B/dT$=−31.1[×$10^{-6}$/K], $\alpha_A$=4.5[×$10^{-6}$/K], and $\alpha_B$=15.7[×$10^{-6}$/K].

As other preferred examples of the combination of the first birefringent crystal 53 and the second birefringent crystal 54, the combination of a $YVO_4$ crystal as the first birefringent crystal 53 and a $CaCO_3$ crystal as the second birefringent crystal 54, the combination of a $YVO_4$ crystal as the first birefringent crystal 53 and a $TiO_2$ crystal as the second birefringent crystal 54, the combination of a $YVO_4$ crystal as the first birefringent crystal 53 and a $SiO_2$ crystal as the second birefringent crystal 54, the combination of a $LiNbo_3$ crystal as the first birefringent crystal 53 and a $CaCO_3$ crystal as the second birefringent crystal 54, the combination of a $LiNbO_3$ crystal as the first birefringent crystal 53 and a $TiO_2$ crystal the second birefringent crystal 54, the combination of a $LiNbO_3$ crystal as the first birefringent crystal 53 and a $SiO_2$ crystal as the second birefringent crystal 54, the combination of a $CaCO_3$ crystal as the first birefringent crystal 53 and a $TiO_2$ crystal as the second birefringent crystal 54, the combination of a $CaCO_3$ crystal as the first birefringent crystal 53 and a $SiO_2$ crystal as the second birefringent crystal 54, and the combination of a $TiO_2$ crystal as the first birefringent crystal 53 and a $SiO_2$ crystal as the second birefringent crystal 54.

As explained above, since the polarization state changing means is configured by the first and the second birefringent crystals 53 and 54, wherein the first and second birefringent crystals 53 and 54 are disposed, and also the lengths of the laser light propagating direction thereof are determined in such a manner as to offset the discrepancy of the shifted value δ caused by a change in the difference of the refractive index and by a change in the length of the propagating direction of the laser light of the first birefringent crystals 53, there is no occurrence of change in the monitored wavelength because of a temperature change, so that no correction due to a temperature change is required.

Note that for adjusting the wavelength monitor of this seventh embodiment, either one or both of the first and the second birefringent crystals are rotatably inclined about an axis perpendicular to the propagating direction of the laser light.

Still further, this seventh embodiment has been explained as to the case that the polarization state changing means configured by the first and the second birefringent crystals 53 and 54 is applied to the first embodiment, but the same effect can be obtained even when it is applied to the second embodiment.

As explained heretofore, the wavelength monitoring device according to the present invention is suitable for accurately monitoring the wavelength.

Further, the adjusting method of a wavelength monitoring device according to the present invention is suitable for adjusting the wavelength monitoring device by use of a birefringent crystal.

Still further, the wavelength stabilizing light source according to the present invention is suitable for outputting optical signals having narrow wavelength widths.

Yet still further, the transmission system according to the present invention is suitable for transmitting a plurality of optical signals.

What is claimed is:

1. A wavelength monitoring device comprising:
    a polarization state changing configuration having a birefringent crystal, which receives a laser light and changes the polarization state of the received laser light, in accordance with the wavelength of the received laser light;
    a polarized light selecting and receiving configuration, which receives the laser light transmitted through said polarization state changing configuration, separates the polarization of said laser light, and receives a portion of the polarization separated laser light, and
    a wavelength detection configuration for monitoring the wavelength of the laser light received by said birefringent crystal as a function of the portion.

2. A wavelength monitoring device according to claim 1, wherein said birefringent crystal is a first birefringent crystal and said polarization state changing configuration further comprises:
    a second birefringent crystal, which receives the laser light transmitted through said first birefringent crystal and changes the polarization state of the laser light, in accordance with the wavelength of the input laser light, wherein said first birefringent crystal and said second birefringent crystal are disposed according to the value of a change in difference between the refraction index of said first birefringent crystal and that of the said second birefringent crystal due to a temperature change, and the length of the propagating direction of said first birefringent crystal and that of said second birefringent crystal are set to a predetermined length, so as to offset the discrepancy between the phase shifted value in the fast axis direction and that in the slow axis direction caused by the change in the difference between the refraction index in the fast axis direction and that in the slow axis direction and by the change in the length of the propagating direction of the laser light of said first birefringent crystal, said changes being caused due to a temperature change.

3. A wavelength monitoring device according to claim 2, wherein the lengths of the propagating direction of said first birefringent and said second birefringent crystals are set in such a manner that the value of $(d\Delta n_A/dT + \alpha_A \cdot \Delta n_A) \cdot L_A + (d\Delta n_B/dT + \alpha_B \cdot \Delta n_B) \cdot L_B$ becomes zero, wherein T indicates temperature, $\Delta n_A$ indicates the difference between the refractive index in the fast axis direction of said first birefringent crystal and that in the slow axis direction of the same, $L_A$ indicates the length of the propagating direction of the laser light of said first birefringent crystal, $\alpha_A$ indicates a linear expansion coefficient of said first birefringent crystal, $\Delta n_B$ indicates the difference between the refractive index in the fast axis direction of said second birefringent crystal and that in the slow axis direction of the same, $L_B$ indicates the length of the propagating direction of the laser light of said second birefringent crystal, $\alpha_B$ indicates a linear expansion coefficient of said second birefringent crystal.

4. A wavelength monitoring device according to claim 2, wherein when the value of $d\Delta n_A/dT$ and that of $d\Delta n_B/dT$ are both positive or negative, said first birefringent and said second birefringent crystals are disposed such that the fast axis direction of said first birefringent crystal coincides with the slow axis direction of the said second birefringent crystal, whereas the slow axis direction of said first birefringent crystal coincides with the fast axis direction of the said second birefringent crystal, wherein T indicates temperature, $\Delta n_A$ indicates the difference between the refractive index in the fast axis direction of said first birefringent crystal and that in the slow axis direction of the same, and $\Delta n_B$ indicates the difference between the refractive index in the fast axis direction of said second birefringent crystal and that in the slow axis direction of the same.

5. A wavelength monitoring device according to claim 4, wherein the wavelength of the laser light input to said first birefringent crystal is $\lambda$, the difference between the refractive index in the fast axis direction of said first birefringent crystal and that in the slow axis direction of the same is $\Delta n_A$, the length of the propagating direction of the laser light of said first birefringent crystal is $L_A$, the difference between the refractive index in the fast axis direction of said second birefringent crystal and that in the slow axis direction of the same is $\Delta n_B$, and the length of the propagating direction of the laser light of said second birefringent crystal is $L_B$, then the value of $\lambda^2/(\Delta n \cdot L_A - \Delta n \cdot L_B)$ is set to be 0.8 nm or more.

6. A wavelength monitoring device according to claim 5, wherein the wavelength of the laser light input to said first birefringent crystal is $\lambda$, the difference between the refractive index in the fast axis direction of said first birefringent crystal and that in the slow axis direction of the same is $\Delta n_A$, the length of the propagating direction of the laser light of said first birefringent crystal is $L_A$, the difference between the refractive index in the fast axis direction of said second birefringent crystal and that in the slow axis direction of the same is $\Delta n_B$, and the length of the propagating direction of the laser light of said second birefringent crystal is $L_B$, then the value of $\lambda^2/(\Delta n \cdot L_A - \Delta n \cdot L_B)$ is set to be 0.8 nm or more.

7. A wavelength monitoring device according to claim 4, wherein the lengths of the propagating direction of said first birefringent and said second birefringent crystals are set in such a manner that the value of $(d\Delta n_A/dT + \alpha_A \cdot \Delta n_A) \cdot L_A + (d\Delta n_B/dT + \alpha_B \cdot \Delta n_B) L_B$ becomes zero, and also the value of $\lambda^2/(\Delta n \cdot L_A - \Delta n \cdot L_B)$ satisfies a desired value, wherein $\lambda$ indicates a wavelength of the laser light input to said first birefringent crystal, $L_A$ indicates the length of the propagating direction of the laser light of said first birefringent crystal, $\alpha_A$ indicates a linear expansion coefficient of said first birefringent crystal, $L_B$ indicates the length of the propagating direction of the laser light of said second birefringent crystal, $\alpha_B$ indicates a linear expansion coefficient of said second birefringent crystal.

8. A wavelength monitoring device according to claim 2, wherein when either one of the value of $\Delta n_A/dT$ and that of $\Delta n_B/dT$ is positive, and the other one is negative, said first birefringent and said second birefringent crystals are disposed such that the fast axis direction of said first birefringent crystal and that of said second birefringent crystals are disposed such that the fast axis direction of said first birefringent crystal and that of said second birefringent crystal coincide with each other, whereas the slow axis direction of said first birefringent crystal and that of said second birefringent crystal also coincide with each, wherein T indicates temperature, $\Delta n_A$ indicates the difference between the refractive index in the fast axis direction of said first birefringent crystal and that in the slow axis direction of the same, and $\Delta n_B$ indicates the difference between the refractive index in the fast axis direction of said second birefringent crystal and that in the slow axis direction of the same.

9. A wavelength monitoring device according to claim 8, wherein the lengths of the propagating direction of said first birefringent and said second birefringent crystals are set in such a manner that the value of $(d\Delta n_A/dT + \alpha_A \cdot \Delta n_A) \cdot L_A + (d\Delta n_B/dT + \alpha_B \cdot \Delta n_B) \cdot L_B$ becomes zero, and also the value of $\lambda^2/(\Delta n \cdot L_A - \Delta n \cdot L_B)$ satisfies a desired value, wherein $\lambda$ indicates a wavelength of the laser light input to said first birefringent crystal, $L_A$ indicates the length of the propagating direction of the laser light of said first birefringent crystal, $\alpha_A$ indicates a linear expansion coefficient of said first birefringent crystal, $L_B$ indicates the length of the propagating direction of the laser light of said second birefringent crystal, $\alpha_B$ indicates a linear expansion coefficient of said second birefringent crystal.

10. A wavelength monitoring device according to claim 2, wherein said first birefringent crystal is made a $YVO_4$ crystal, and said second birefringent crystal is made of a $LiNbO_3$ crystal.

11. A wavelength monitoring device according to claim 2, wherein said first birefringent crystal is made a $YVO_4$ crystal, and said second birefringent crystal is made of a $CaCO_3$ crystal.

12. A wavelength monitoring device according to claim 2, wherein said first birefringent crystal is made a $YVO_4$ crystal, and said second birefringent crystal is made of a $TiO_2$ crystal.

13. A wavelength monitoring device according to claim 2, wherein said first birefringent crystal is made a $YVO_4$ crystal, and said second birefringent crystal is made of a $SiO_2$ crystal.

14. A wavelength monitoring device according to claim 2, wherein said first birefringent crystal is made a $LiNbO_3$ crystal, and said second birefringent crystal is made of a $CaCO_3$ crystal.

15. A wavelength monitoring device according to claim 2, wherein said first birefringent crystal is made a $LiNbO_3$ crystal, and said second birefringent crystal is made of a $TiO_2$ crystal.

16. A wavelength monitoring device according to claim 2, wherein said first birefringent crystal is made a $LiNbO_3$ crystal, and said second birefringent crystal is made of a $SiO_2$ crystal.

17. A wavelength monitoring device according to claim 2, wherein said first birefringent crystal is made a $CaCO_3$ crystal, and said second birefringent crystal is made of a $TiO_2$ crystal.

18. A wavelength monitoring device according to claim 2, wherein said first birefringent crystal is made a $CaCO_3$ crystal, and said second birefringent crystal is made of a $SiO_2$ crystal.

19. A wavelength monitoring device according to claim 2, wherein said first birefringent crystal is made a $TiO_2$ crystal, and said second birefringent crystal is made of a $SiO_2$ crystal.

20. A wavelength monitoring device according to claim 2 wherein either one or both of said first birefringent and said second birefringent crystals are rotated about an axis perpendicular to the propagating direction of the laser light input to said first birefringent and said second birefringent crystals.

21. A wavelength monitoring device according to claim 1, wherein the laser light input to said birefringent crystal is a linearly polarized light.

22. A wavelength monitoring device according to claim 21, wherein said birefringent crystal is disposed in such a manner that its fast axis is inclined for 45 degrees with respect to the polarizing direction of the laser light input to said birefringent crystal.

23. A wavelength monitoring device according to claim 1, wherein said polarized light selecting and receiving configuration comprises:
   a polarized light separating configuration for inputting the laser light transmitted through said polarization state changing configuration and extracting a predetermined linearly polarized component therefrom, and
   a polarized light receiving configuration for receiving the linearly polarized component extracted from said polarized light separating configuration.

24. A wavelength monitoring device according to claim 23 further comprising a light condensing configuration for condensing the linearly polarized component extracted from said polarized light separating configuration between said polarized light separating configuration and said polarized light receiving configuration.

25. A wavelength monitoring device according to claim 23, wherein said polarized light separating configuration is provided on an input-side surface of said polarized light receiving configuration.

26. A wavelength monitoring device according to claim 23, wherein said polarized light separating configuration inputs a laser light transmitted through said polarization state changing configuration and separates it into a first linearly polarized component and a second linearly polarized component polarizing at right angles to each other and extracts the thus separated components, and said polarized light receiving configuration further comprises a light receiving configuration for the first component for receiving the first linearly polarized component extracted from said polarized light separating configuration, and also a light receiving configuration for the second component for receiving the second linearly polarized component extracted from said polarized light separating configuration.

27. A wavelength monitoring device according to claim 26, wherein said light receiving element for the first component further comprises a first and a second light receiving elements, and said light receiving element for the second component further comprises a third and a fourth light receiving elements.

28. A wavelength monitoring device according to claim 27, wherein said first to fourth light receiving elements are provided on a same base plate.

29. A wavelength monitoring device according to claim 26, wherein said polarized light separating configuration further comprises a polarizer for transmitting either one of said first linearly polarized component and said second linearly polarized component, while reflecting the other.

30. A wavelength monitoring device according to claim 26, wherein said polarized light separating configuration further comprises a 2-quadrant polarizer provided with a first area for inputting a laser light transmitted through said polarization state changing configuration and transmitting only the first linearly polarized component, and a second area for inputting a laser light transmitted through said polarization state changing configuration and transmitting only the second linearly polarized component.

31. A wavelength monitoring device according to claim 30, wherein said 2-quadrant polarizer is provided on an output-side surface of said polarization state changing configuration.

32. A wavelength monitoring device according to claim 26, wherein said polarized light separating configuration further comprises a laser light 3-dividing element provided with a first area for inputting a laser light transmitted through said polarization state changing configuration and transmitting only the first linearly polarized component, a second area for inputting a laser light transmitted through said polarization state changing configuration and transmitting only the second linearly polarized component, and a third area for inputting a laser light transmitted through said polarization state changing configuration and transmitting it without changing its polarization state.

33. A wavelength monitoring device according to claim 32 further comprising a laser light receiving configuration for receiving a laser light transmitted through said third area, and a strength detection configuration for monitoring the change in a laser light source whose wavelength is to be monitored, by use of an optical signal output from said laser light receiving configuration.

34. A wavelength monitoring device according to claim 33, wherein said wavelength detection configuration further comprises:
   a subtractor for outputting the difference between the optical signal output from said light receiving configuration for the first component and the optical signal output from said light receiving configuration for the second component, and
   a divider for outputting the ratio of the difference signal output from said subtractor to the strength-monitored signal output from said strength detection configuration.

35. A wavelength monitoring device according to claim 34, wherein said subtractor further comprises:
   a first gain adjuster for adjusting the strength of the optical signal output from said light receiving configuration for the first component, and
   a second gain adjuster for adjusting the strength of the optical signal output from said light receiving configuration for the second component.

36. A wavelength monitoring device according to claim 32, wherein said laser light 3-dividing element is provided on an output-side surface of said polarization state changing configuration.

37. A wavelength monitoring device according to claim 36, wherein said wavelength detection configuration further comprises a divider for outputting the ratio of the optical signal output from either one of said light receiving configuration for the first component and the optical signal output from said light receiving configuration for the second component to the strength-monitored signal output from said strength detection configuration.

38. A wavelength monitoring device according to claim 26, wherein said wavelength detection configuration further comprises a subtractor for outputting the difference between the optical signal output from said light receiving configuration for the first component and the optical signal output from said light receiving configuration for the second component.

39. A wavelength monitoring device according to claim 38, wherein said subtractor further comprises:
   a first gain adjuster for adjusting the strength of the optical signal output from said light receiving configuration for the first component, and
   a second gain adjuster for adjusting the strength of the optical signal output from said light receiving configuration for the second component.

40. A wavelength monitoring device according to claim 26, wherein said wavelength detection configuration further comprises an adder for outputting the sum of the optical signal output from said light receiving configuration for the first component and the optical signal output from said light receiving configuration for the second component.

41. A wavelength monitoring device according to claim 26, wherein said wavelength detection configuration further comprises:
- a subtractor for outputting the difference between the optical signal output from said light receiving configuration for the first component and the optical signal output from said light receiving configuration for the second component,
- an adder for outputting the sum of the optical signal output from said light receiving configuration for the first component and the optical signal output from said light receiving configuration for the second component, and
- a divider for outputting the ratio of the difference signal output from said subtractor to the sum signal output from said adder.

42. A wavelength monitoring device according to claim 41, wherein said subtractor further comprises:
- a first gain adjuster for adjusting the strength of the optical signal output from said light receiving configuration for the first component, and
- a second gain adjuster for adjusting the strength of the optical signal output from said light receiving configuration for the second component.

43. A wavelength monitoring device according to claim 26, wherein said wavelength detection configuration further comprises:
- an adder for outputting the sum of the optical signal output from said light receiving configuration for the first component and the optical signal output from said light receiving configuration for the second component, and
- a divider for outputting the ratio of the optical signal output from either one of said light receiving configuration for the first component and the optical signal output from said light receiving configuration for the second component to the sum signal output from said adder.

44. A wavelength monitoring device according to claim 1, wherein said birefringent crystal, said polarized light separating configuration and said polarized light selecting and receiving configuration are disposed such that the input-side and emitting-side surfaces of each are inclined with respect to the laser light propagating direction.

45. A wavelength monitoring device according to claim 1, wherein when the wavelength of a laser light input to said birefringent crystal is λ, the difference between the refractive index in the fast axis direction of the birefringent crystal and that in the slow axis direction of the same is Δn, and the length of the propagating direction of the laser light of said birefrigent crystal is L, then the value obtained by $\lambda^2/(\Delta nL)$ becomes 0.8 nm or more.

46. A wavelength monitoring device according to claim 1 wherein said birefringent crystal is rotated about an axis perpendicular to the propagating direction of the laser light input to said birefringent crystal.

47. A wavelength monitoring device according to claim 1, wherein the laser light input to said birefringent crystal is circularly polarized light.

48. A wavelength monitoring device according to claim 1, wherein the laser light input to said birefringent crystal is elliptically polarized light.

49. A wavelength monitoring device comprising:
- a polarization state changing configuration having a birefringent crystal, which receives a laser light and changes the polarization state of the received laser light, in accordance with the wavelength of the received laser light;
- a polarized light separating configuration for inputting the laser light transmitted through said polarization state changing configuration and extracting a predetermined linearly polarized component therefrom;
- a polarized light receiving configuration for receiving the linearly polarized component extracted from said polarized light separating configuration;
- a wavelength detection configuration for monitoring the wavelength of the laser light received by said birefringent crystal by use of an optical signal output from said polarized light receiving configuration;
- a laser light receiving configuration for receiving the laser light that has not passed through said polarized light separating configuration; and
- a strength detection means for monitoring the change in the strength of a laser light source whose wavelength is to be monitored, by use of optical signals output from said polarized light receiving configuration and said laser light receiving configuration.

50. A wavelength monitoring device according to claim 49, wherein said wavelength detection means further comprises a divider for outputting the ratio of the optical signal output from said polarized light receiving configuration to the strength-monitored signal output from said strength detection configuration.

51. A wavelength monitoring device according to claim 49, wherein said birefringent crystal is a first birefringent crystal and said polarization state changing configuration further comprises:
- a second birefringent crystal, which receives the laser light transmitted through said first birefringent crystal and changes the polarization state of the laser light in accordance with the wavelength of the input laser light, wherein said first birefringent crystal and said second birefringent crystal are disposed according to the value of a change in difference between the refraction index of said first birefringent crystal and that of said second birefringent crystal due to a temperature change, and the length of the propagating direction of said first birefringent crystal and that of said second birefringent crystal are se to a predetermined length, so as to offset the discrepancy between the phase shifted value in the fast axis direction and that in the slow axis direction caused by the change in the difference between the refractive index in the fast axis direction and that in the slow axis direction and by the change in the length of the propagating direction of the laser light of said first birefringent crystal, said changes being caused due to a temperature change.

52. A wavelength monitoring device according to claim 51, wherein the lengths of the propagating direction of said first birefringent and said second birefringent crystals are set in such a manner that the value of $(d\Delta n_A/dT+\alpha_A \cdot \Delta n_A) \cdot L_A + (d\Delta \cdot n_B/dT+\alpha_B \cdot \Delta n_B) \cdot L_B$ becomes zero, wherein T indicates temperature, $\Delta n_A$ indicates the difference between the refractive index in the fast axis direction of said first birefringent crystal and that in the slow axis direction of the same, $L_A$ indicates the length of the propagating direction of the laser light of said first birefringent crystal, $\Delta_A$ indicates a linearly expansion coefficient of said first birefringent crystal, $\Delta n_B$ indicates the difference between the refractive index in the fast axis direction of said second birefringent crystal and that in the slow axis direction of the same, $L_B$ indicates the length of the propagating direction of the laser light of said second birefringent crystal, and $\alpha_B$ indicates a linear expansion coefficient of said second birefringent crystal.

53. A wavelength monitoring device according to claim 51, wherein when the value of $d\Delta n_A/dT$ and that of $\Delta n_B/dT$ are both positive or negative, said first birefringent and said second birefringent crystals are disposed such that the fast axis direction of said first birefringent crystal coincides with the slow axis direction of said second birefringent crystal, whereas the slow axis direction of said first birefringent crystal coincides with the fast axis direction of the said second birefringent crystal, wherein T indicates temperature, $\Delta n_A$ indicates the difference between the refractive index in the fast axis direction of said first birefringent crystal and that in the slow axis direction of the same, and $\Delta n_B$ indicates the difference between the refractive index in the fast axis direction of said second birefringent crystal and that in the slow axis direction of the same.

54. A wavelength monitoring device according to claim 53, wherein the wavelength of the laser light input to said first birefringent crystal is $\lambda$, the difference between the refractive index in the fast axis direction of said first birefringent crystal and that in the slow axis direction of the same is $\Delta n_A$, the length of the propagating direction of the laser light of said first birefringent crystal is $L_A$, the difference between the refractive index in the fast axis direction of said second birefringent crystal and that in the slow axis direction of the same is $\Delta n_B$, and the length of the propagating direction of the laser light of said second birefringent crystal is $L_B$, then the value of $\lambda^2/(\Delta n \cdot L_A - \Delta n \cdot L_B)$ is set to be 0.8 nm or more.

55. A wavelength monitoring device according to claim 54, wherein the wavelength of the laser light input to said first birefringent crystal is $\lambda$, the difference between the refractive index in the fast axis direction of said first birefringent crystal and that in the slow axis direction of the same is $\Delta n_A$, the length of the propagating direction of the laser light of said first birefringent crystal is $L_A$, the difference between the refractive index in the fast axis direction of said second birefringent crystal and that in the slow axis direction of the same is $\Delta n_B$, and the length of the propagating direction of the laser light of said second birefringent crystal is $L_B$, then the value of $\lambda^2/(\Delta n \cdot L_A + \Delta n \cdot L_B)$ is set to be 0.8 nm or more.

56. A wavelength monitoring device according to claim 53, wherein the length of the propagating direction of said first birefringent and said second birefringent crystals are set in such a manner that the value of $(d\Delta n_A/dT + \alpha_A \cdot \Delta n_A) \cdot L_A + (d\Delta n_B/dT + \alpha_B \cdot \Delta n_B) \cdot L_B$ becomes zero, and also the value of $\lambda^2/(\Delta n \cdot L_A - \Delta n \cdot L_B)$ satisfies a desired value, wherein $\lambda$ indicates a wavelength of the laser light input to said first birefringent crystal, $L_A$ indicates the length of the propagating direction of the laser light of said first birefringent crystal, $\alpha_A$ indicates a linear expansion coefficient of said first birefringent crystal, $L_B$ indicates the length of the propagating direction of the laser light of said second birefringent crystal, and $\alpha_B$ indicates a linear expansion coefficient of said second birefringent crystal.

57. A wavelength monitoring device according to claim 51, wherein when either one of the value of $d\Delta n_A/dT$ and that of $\Delta n_B/dT$ is positive, and the other one is negative, said first birefrigent and said second birefringent crystals are disposed such that the fast axis direction of said first birefringent crystal and that of said second birefringent crystal coincide with each other, whereas the slow axis direction of said first birefringent crystal and that of said second birefringent crystal also coincide with each, wherein T indicates temperature, $\Delta n_A$ indicates the difference between the refractive index in the fast axis direction of said first birefringent crystal and that in the slow axis direction of the same, and $\Delta n_B$ indicates the difference between the refractive index in the fast axis direction of said second birefringent crystal and that in the slow axis direction of the same.

58. A wavelength monitoring device according to claim 57, wherein the lengths of the propagating direction of said first birefringent and said second birefringent crystals are set such that the value of $(d\Delta n_A/dT + \alpha_A \cdot \Delta n_A) \cdot L_A + (d\Delta n_B/dT + \alpha_B \cdot \Delta n_B) \cdot L_B$ becomes zero, and also the value of $\lambda^2/(\Delta n \cdot L_A + \Delta n \cdot L_B)$ satisfies a desired value, wherein $\lambda$ indicates a wavelength of the laser light input to said first birefringent crystal, $L_A$ indicates the length of the propagating direction of the laser light of said first birefringent crystal, $\alpha_A$ indicates a linear expansion coefficient of said first birefringent crystal, $L_B$ indicates the length of the propagating direction of the laser light of said second birefringent crystal, and $\alpha_B$ indicates a linear expansion coefficient of said second birefringent crystal.

59. A wavelength monitoring device according to claim 51, wherein said birefringent crystal is made a $YVO_4$ crystal, and said second birefringent crystal is made of a $LiNbO_3$ crystal.

60. A wavelength monitoring device according to claim 51, wherein said birefringent crystal is made of a $YVO_4$ crystal, and said second birefringent crystal is made of a $CaCO_3$ crystal.

61. A wavelength monitoring device according to claim 51, wherein said birefringent crystal is made of a $YVO_4$ crystal, and said second birefringent crystal is made of a $TiO_2$ crystal.

62. A wavelength monitoring device according to claim 51, wherein said birefringent crystal is made of a $YVO_4$ crystal, and said second birefringent crystal is made of a $SiO_2$ crystal.

63. A wavelength monitoring device according to claim 51, wherein said birefringent crystal is made of a $LiNbO_3$ crystal, and said second birefringent crystal is made of a $CaCO_3$ crystal.

64. A wavelength monitoring device according to claim 51, wherein said birefringent crystal is made of a $LiNbO_3$ crystal, and said second birefringent crystal is made of a $TiO_2$ crystal.

65. A wavelength monitoring device according to claim 51, wherein said birefringent crystal is made of a $LiNbO_3$ crystal, and said second birefringent crystal is made of a $SiO_2$ crystal.

66. A wavelength monitoring device according to claim 51, wherein said birefringent crystal is made of a $CaCO_3$ crystal, and said second birefringent crystal is made of a $TiO_2$ crystal.

67. A wavelength monitoring device according to claim 51, wherein said birefringent crystal is made of a $CaCO_3$ crystal, and said second birefringent crystal is made of a $SiO_2$ crystal.

68. A wavelength monitoring device according to claim 51, wherein said birefringent crystal is made of a $TiO_2$ crystal, and said second birefringent crystal is made of a $SiO_2$ crystal.

69. A wavelength monitoring device according to claim 49, wherein said birefringent crystal, said polarized light separating configuration and said polarized light selecting and receiving configuration are disposed such that the input-side and emitting-side surfaces of each are inclined with respect to the laser light propagating direction.

70. A wavelength monitoring device according to claim 49, wherein said wavelength detection configuration further comprises a divider for outputting the ratio of the optical signal output from said polarized light receiving configuration to the strength-monitored signal output from said strength detection configuration.

71. A wavelength monitoring device according to claim 49, wherein the laser light input to said birefringent crystal is linearly polarized light.

72. A wavelength monitoring device according to claim 49, wherein said birefringent crystal is disposed in such a manner that its fast axis is inclined for 45 degrees with respect to the polarizing direction of the laser light input to said birefringent crystal.

73. A wavelength monitoring device according to claim 49, wherein when the wavelength of a laser light input to said birefringent crystal is $\lambda$, the difference between the refractive index in the fast axis direction of the birefringent crystal and that in the slow axis direction of the same is $\Delta n$, and the length of the propagating direction of the laser light of said birefringent crystal is L, then the value obtained by $\lambda^2/(\Delta nL)$ becomes 0.8 nm or more.

74. A wavelength monitoring device according to claim 49 wherein said birefringent crystal is rotated about an axis perpendicular to the propagating direction of the laser light input to said birefringent crystal.

75. A method of adjusting the wavelength monitoring device recited in claim 49 including the step of inclining either one or both of said first and second birefringent crystals by rotating them about an axis perpendicular to the propagating direction of the laser light input to said first and second birefringent crystals.

76. A wavelength monitoring device according to claim 49 wherein the laser light input to said birefringent crystal is circularly polarized light.

77. A wavelength monitoring device according to claim 49, wherein the laser light input to said birefringent crystal is elliptically polarized light.

78. A laser light stabilizing light source comprising:
   a semiconductor laser;
   a wavelength monitoring device comprising:
      a polarization state changing configuration having birefringent crystal, which receives a laser light and changes the polarization state of the received laser light, in accordance with the wavelength of the received laser light,
      a polarized light selecting and receiving configuration which receives the laser light transmitted through said polarization state changing configuration, separates the polarization of said laser light, and selectively receives a portion of the polarization separated laser light, and
      a wavelength detection configuration for monitoring the wavelength of the laser light received by said birefringent crystal as a function of the portion; and
   a laser drive control device for activating said semiconductor laser, and controlling the oscillated wavelength of said semiconductor laser by use of a wavelength-monitored signal output from said wavelength monitoring device.

79. A wavelength monitoring device according to claim 78, wherein said polarized light selecting and receiving configuration comprises:
   a polarized light separating configuration for inputting the laser light transmitted through said polarization state changing means and extracting a predetermined linearly polarized component therefrom; and
   a polarized light receiving configuration for receiving the linearly polarized component extracted from said polarized light separating means.

80. A wavelength monitoring device according to claim 79 further comprising a light condensing means for condensing the linearly polarized component extracted from said polarized light separating means between said polarized light separating configuration and said polarized light receiving configuration.

81. A wavelength monitoring device according to claim 79, wherein said polarized light separating configuration is provided on an input-side surface of said polarized light receiving configuration.

82. A wavelength monitoring device according to claim 79, wherein said polarized light separating configuration inputs a laser light transmitted through said polarization state changing configuration and separates it into a first linearly polarized component and a second linearly polarized component polarizing at right angles to each other and extracts the thus separated components, and said polarized light receiving configuration further comprises a light receiving configuration for the first component for receiving the first linearly polarized component extracted from said polarized light separating configuration, and also a light receiving configuration for the second component for receiving the second linearly polarized component extracted from said polarized light separating configuration.

83. A wavelength monitoring device according to claim 82, wherein said wavelength detection configuration further comprises an adder for outputting the sum of the optical signal output from said light receiving configuration for the first component and the optical signal output from said light receiving configuration for the second component.

84. A wavelength monitoring device according to claim 82, wherein said polarized light separating configuration further comprises a polarizer for transmitting either one of said first linearly polarized component and said second linearly polarized component, while reflecting the other.

85. A wavelength monitoring device according to claim 82, wherein said wavelength detection configuration further comprises:
   an adder for outputting the sum of the optical signal output from said light receiving configuration for the first component and the optical signal output from said light receiving configuration for the second component; and
   a divider for outputting the ratio of the optical signal output from either one of said light receiving configuration for the first component and the optical signal output from said light receiving configuration for the second component to the sum signal output from said adder.

86. A wavelength monitoring device according to claim 82, wherein said polarized light separating configuration further comprises a laser light 3-dividing element provided with a first area for inputting a laser light transmitted through said polarization state changing [means] configuration and transmitting only the first linearly polarized component, a. second area for inputting a laser light transmitted through said polarization state changing configuration and transmitting only the second linearly polarization component, and a third area for inputting a laser light transmitted through said polarization state changing configuration and transmitting it without changing its polarization state.

87. A wavelength monitoring device according to claim 86, further comprising a laser light receiving configuration for receiving a laser light transmitted through said third area, and a strength detecting means for monitoring the change in a laser light source whose wavelength is to be monitored, by use of an optical signal output from said laser light receiving configuration.

88. A wavelength monitoring device according to claim 87, wherein said wavelength detection configuration further comprises:
a subtractor for outputting the differences between the optical signal output from said light receiving configuration for the first component and the optical signal output from said light receiving configuration for the second component; and
a divider for outputting the ratio of the difference signal output from said subtractor to the strength-monitored signal output from said strength detection configuration.

89. A wavelength monitoring device according to claim 88, wherein said subtractor further comprises:
a first gain adjuster for adjusting the strength of the optical signal output from said light receiving configuration for the first component; and
a second gain adjuster for adjusting the strength of the optical signal output from said light receiving configuration for the second component.

90. A wavelength monitoring device according to claim 86, wherein said laser light 3-dividing element is provided on an output-side surface of said polarization state changing configuration.

91. A wavelength monitoring device according to claim 90, wherein said wavelength detection configuration further comprises a divider for outputting the ratio of the optical signal output from either one of said light receiving configuration for the first component and the optical signal output from said light receiving configuration for the second component to the strength-monitored signal output from said strength detection configuration.

92. A wavelength monitoring device according to claim 82, wherein said light receiving element for the first component further comprises a first and a second light receiving elements, and said light receiving element for the secone component further comprises a third and a fourth light receiving element.

93. A wavelength monitoring device according to claim 72, wherein said first to fourth light receiving elements are provided on a same base plate.

94. A wavelength monitoring device according to claim 82, wherein said wavelength detection configuration further comprises a subtractor for outputting the difference between the optical signal output from said light receiving configuration for the first component and the optical signal output from said light receiving configuration for the second component.

95. A wavelength monitoring device according to claim 94, wherein said subtractor further comprises:
a first gain adjuster for adjusting the strength of the optical signal output from said light receiving configuration for the first component; and
a second gain adjuster for adjusting the strength of the optical signal output from said light receiving configuration for the second component.

96. A wavelength monitoring device according to claim 82, wherein said wavelength detection configuration further comprises:
a subtractor for outputting the difference between the optical signal output from said light receiving configuration for the first component and the optical signal output from said light receiving configuration for the second component;
an adder for outputting the sum of the optical signal output from said light receiving configuration for the first component and the optical signal output from said light receiving configuration for the second component; and
a divider for outputting the ratio of the difference signal output from said subtractor to the sum signal output from said adder.

97. A wavelength monitoring device according to claim 96, wherein said subtractor further comprises:
a first gain adjuster for adjusting the strength of the optical signal output from said light receiving configuration for the first component; and
a second gain adjuster for adjusting the strength of the optical signal output from said light receiving configuration for the second component.

98. A wavelength monitoring device according to claim 82, wherein said polarized light separating configuration further comprises a 2-quadrant polarizer provided with a first area for inputting a laser light transmitted through said polarization state changing configuration and transmitting only the first linearly polarized component, and a second area for inputting a laser light transmitted through said polarization state changing configuration and transmitting only the second linearly polarized component.

99. A wavelength monitoring device according to claim 98, wherein said 2-quadrant polarizer is provided on an output-side surface of said polarization state changing configuration.

100. A laser light stablizing light source according to claim 78, wherein said laser drive control device controls the oscillated wavelength by adjusting a current injected to said semiconductor laser by use of the wavelength-monitored signal output from said wavelength monitoring device.

101. A laser light stabilizing light source according to claim 78, wherein said laser drive control device controls the oscillated wavelength by adjusting the temperature of said semiconductor laser, by use of the wavelength-monitored signal output from said wavelength monitoring device.

102. A laser light stabilizing light source according to claim 78, wherein said laser drive control device controls the oscillated wavelength by adjusting the length of a resonator of said semiconductor laser, by use of the wavelength-monitored signal output from said wavelength monitoring device.

103. A laser light stabilizing light source according to claim 78, wherein said laser drive control device controls the oscillated wavelength by adjusting the periodic cycle of a diffraction grating provided to said semiconductor laser by use of a wavelength-monitored signal output from said wavelength monitoring device.

104. A laser light stabilizing light source according to claim 78, wherein a laser light collimating means for collimating the laser light emitted from said semiconductor laser is provided between said semiconductor laser and said wavelength monitoring device.

105. A laser light stabilizing light source according to claim 78, wherein a transmitter means for transmitting the laser light emitted from said semiconductor laser to said wavelength monitoring device is provided between said semiconductor laser and said wavelength monitoring device.

106. A laser light stabilizing light source according to claim 78, wherein said semiconductor laser, said wavelength monitoring device and said laser drive control device are accommodated in one module.

107. A transmission system comprising a plurality of laser light stabilizing sources and one or more transmission configuration for transmitting a laser light, wherein each of said stabilizing sources comprises:
a semiconductor laser;
a wavelength monitoring device comprising:
a polarization state changing configuration having a birefringent crystal, which receives a laser light and changes the polarization state of the received laser light, in accordance with the wavelength of the received laser light;
a polarized light selecting and receiving configuration which receives the laser light transmitted through said polarization state changing configuration, separates the polarization of said laser light, and selectively receives a portion of the polarization separated laser light;
a wavelength detection configuration for monitoring the wavelength of the laser light received by said birefringent crystal as a function of the portion; and
a laser drive control device for activating said semiconductor laser, and controlling the oscillated wavelength of said semiconductor laser, and controlling the oscillated wavelength of said semiconductor laser by use of a wavelength-monitored signal output from said wavelength monitoring device.

108. A transmission system comprising a plurality of laser light stabilizing sources and one or more than one transmission means for transmitting a laser light,
wherein each of said stabilizing sources comprises:
a semiconductor laser;
a wavelength monitoring device comprising:
a polarization state changing configuration having a birefringent crystal, which receives a laser light from said laser and changes the polarization state of the received laser light, in accordance with the wavelength of the received laser light,
a polarized light separating configuration for inputting the laser light transmitted through said polarization state changing configuration and extracting a predetermined linearly polarized component therefrom,
a polarized light receiving configuration for receiving the linearly polarized component extracted from said polarized light separating configuration,
a wavelength configuration for monitoring the wavelength of the laser light received by said birefringent crystal by use of an optical signal output from said polarized light receiving configuration,
a laser light receiving configuration for receiving the laser light that has not passed through said polarized light separating configuration, and
a strength detection configuration for monitoring the change in the strength of a laser light source whose wavelength is to be monitored, by use of optical signals output from said polarized light receiving configuration and said laser light receiving configuration; and
a laser drive control device for activating said semiconductor laser, and controlling the oscillated wavelength of said semiconductor laser by use of a wavelength-monitored signal output from said wavelength monitoring device.

109. A laser light stabilizing light source comprising:
a semiconductor laser;
the wavelength monitoring device comprising:
a polarization state changing configuration having a birefringent crystal, which receives a laser light from said laser and changes the polarization state of the received laser light, in accordance with the wavelength of the received laser light,
a polarized light separating configuration for inputting the laser light transmitted through said polarization state changing configuration and extracting a predetermined linearly polarized component therefrom,
a polarized light receiving configuration for receiving the linearly polarized component extracted from said polarized light separating configuration,
a wavelength configuration for monitoring the wavelength of the laser light received by said birefringent crystal by use of an optical signal output from said polarized light receiving configuration,
a laser light receiving configuration for receiving the laser light that has not passed through said polarized light separating configuration, and
a strength detection configuration for monitoring the change in the strength of a laser light source whose wavelength is to be monitored, by use of optical signals output from said polarized light receiving configuration and said laser light receiving configuration; and
a laser drive control device for activating said semiconductor laser, and controlling the oscillated wavelength of said semiconductor laser by use of a wavelength-monitored signal output from said wavelength monitoring device.

110. A laser light stabilizing light source according to claim 109, wherein said laser drive control device controls the oscillated wavelength by adjusting a current injected to said semiconductor laser by use of the wavelength-monitored signal output from said wavelength monitoring device.

111. A laser light stabilizing light source according to claim 109, wherein said laser drive control device controls the oscillated wavelength by adjusting the temperature of said semiconductor laser, by use of the wavelength-monitored signal output from said wavelength monitoring device.

112. A laser light stabilizing light source according to claim 109, wherein said laser drive control device controls the oscillated wavelength by adjusting the length of a resonator of said semiconductor laser, by use of the wavelength-monitored signal output from said wavelength monitoring device.

113. A laser light stabilizing light source according to claim 109, wherein said laser drive control device controls the oscillated wavelength by adjusting the periodic cycle of a diffraction grating provided to said semiconductor laser by use of a wavelength-monitored signal output from said wavelength monitoring device.

114. A laser light stabilizing light source according to claim 109, wherein a laser light collimating means for collimating the laser light emitted from said semiconductor laser is provided between said semiconductor laser and said wavelength monitoring device.

115. A laser light stabilizing light source according to claim 109, wherein a transmitter means for transmitting the laser light emitted from said semiconductor laser to said wavelength monitoring device is provided between said semiconductor laser and said wavelength monitoring device.

116. A laser light stabilizing light source according to claim 109, wherein said semiconductor laser, said wavelength monitoring device and said laser drive control device are accommodated in one module.

* * * * *

UNITED STATES PATENT AND TRADEMARK OFFICE
CERTIFICATE OF CORRECTION

PATENT NO. : 6,567,437 B1 Page 1 of 1
DATED : May 20, 2003
INVENTOR(S) : Masao Imaki et al.

It is certified that error appears in the above-identified patent and that said Letters Patent is hereby corrected as shown below:

Column 43,
Line 39, change to -- 93. A wavelength monitoring device according to claim [72]92, wherein said first to fourth light receiving elements are provided on a same base plate. --

Signed and Sealed this

Twenty-first Day of September, 2004

JON W. DUDAS
*Director of the United States Patent and Trademark Office*

UNITED STATES PATENT AND TRADEMARK OFFICE
CERTIFICATE OF CORRECTION

PATENT NO.   : 6,567,437 B1
DATED        : May 20, 2003
INVENTOR(S)  : Masao Imaki et al.

It is certified that error appears in the above-identified patent and that said Letters Patent is hereby corrected as shown below:

<u>Column 43,</u>
Line 39, change to -- 93. A wavelength monitoring device according to claim 92, wherein said first to fourth light receiving elements are provided on a same base plate. --

This certificate supersedes Certificate of Correction issued September 21, 2004.

Signed and Sealed this

Twenty-second Day of March, 2005

JON W. DUDAS
*Director of the United States Patent and Trademark Office*